(12) United States Patent
Marchand et al.

(10) Patent No.: US 11,290,128 B2
(45) Date of Patent: Mar. 29, 2022

(54) SIMPLIFIED CHECK NODE PROCESSING IN NON-BINARY LDPC DECODER

(71) Applicant: UNIVERSITE DE BRETAGNE SUD, Lorient (FR)

(72) Inventors: Cédric Marchand, Queven (FR); Emmanuel Boutillon, Lorient (FR)

(73) Assignee: UNIVERSITE DE BRETAGNE SUD, Lorient (FR)

( * ) Notice: Subject to any disclaimer, the term of this patent is extended or adjusted under 35 U.S.C. 154(b) by 37 days.

(21) Appl. No.: 16/621,830

(22) PCT Filed: Jun. 7, 2018

(86) PCT No.: PCT/EP2018/064994
§ 371 (c)(1),
(2) Date: Dec. 12, 2019

(87) PCT Pub. No.: WO2018/234052
PCT Pub. Date: Dec. 27, 2018

(65) Prior Publication Data
US 2021/0143838 A1     May 13, 2021

(30) Foreign Application Priority Data
Jun. 19, 2017   (EP) .................................. 17305752

(51) Int. Cl.
*H03M 13/00* (2006.01)
*H03M 13/11* (2006.01)
*H03M 13/15* (2006.01)

(52) U.S. Cl.
CPC .... *H03M 13/1171* (2013.01); *H03M 13/1117* (2013.01); *H03M 13/1575* (2013.01); *H03M 13/612* (2013.01); *H03M 13/658* (2013.01)

(58) Field of Classification Search
CPC .......... H03M 13/1171; H03M 13/1117; H03M 13/1575; H03M 13/612; H03M 13/658
See application file for complete search history.

(56) References Cited

U.S. PATENT DOCUMENTS

2016/0373136 A1* 12/2016 Ismail ................ H03M 13/1134
2019/0324849 A1* 10/2019 Kim ........................ G11C 29/42

FOREIGN PATENT DOCUMENTS

| EP | 3242405 A1 | 11/2017 |
| EP | 3419179 A1 | 12/2018 |
| EP | 17305748.0 A1 | 12/2018 |

OTHER PUBLICATIONS

Boutillon, E and Conde-Canencia, L.. "Bubble Check: A Simplified Algorithm for Elementary Check Node Processing in Extended Min-Sum Non-Binary LDPC Decoders", Electronic Letters, vol. 46, No. 9, Apr. 29, 2010.

(Continued)

*Primary Examiner* — Christine T. Tu
(74) *Attorney, Agent, or Firm* — Meagher Emanuel Laks Goldberg & Liao, LLP.

(57) ABSTRACT

Embodiments of the invention provide a decoder comprising at least one check node processing unit configured to receive at least three variable node messages from one or more variable node processing units and to determine one or more check node messages, wherein the at least one check node processing unit comprises at least two blocks of sub-check nodes, each block of sub-check node being configured to:
determine a set of sub-check node syndromes from at least one variable node message among the at least three variable node messages; and
determine at least one check node message from at least one syndrome.

16 Claims, 10 Drawing Sheets

(56) References Cited

OTHER PUBLICATIONS

N. Wibereg, HA. Loeliger, and R. Kotter, 'Codes and Iterative Decoding on General Graphs', European Transactions an Telecommunications and Related Technologies, special issue on Turbo Coding, Jun. 1995.

Declerq, D. and Fossorier, M. "Decoding Algorithms for Nonbinary LDPC Codes Over GF(q)", IEEE Transactions on Communications, vol. 55, No. 4, pp. 633-643 (Apr. 2007).

Boutillon, E., Conde-Canencia, L., and Ghouwayel, A. "Design of a GF(64)-LDPC Decoder Based on EMS Algorithm", IEEE Transactions on Circuits and Systems, Regular Papers, vol. 60, No. 10, pp. 2644-2656, Oct. 2013.

Barnault, L. and Declercq, D. "Fast Decoding Algorithm for LDPC over (GF(q)", IEEE Information Theory Workshop, pp. 70-73, Apr. 4, 2003.

Korb, M. and Blanksby, A. "Non-Binary LDPC Codes over Finite Division Near Rings", 23rd International Conference on Telecommunications (ICT), pp. 1-7, 2016.

Li, E., Garcia-Herrero, F., Declercq, D. Gunnam, K., Lacruz, J. and Valls, J., "Low Latency T-EMS Decoder for Non-Binary LDPC Codes", Asilomar Conference on Signals, Systems and Computers, pp. 831-835, 2013.

Savin, V. "Min-Max Decoding for Non Binary LDPC Codes", IEEE International Symposium on Information Theory, pp. 960-964, Jul. 6, 2008.

Schlafer, P., Rybalkin, V., Wehn, N., Alles M., Lehnigk-Emden, T. and Boutillon, E. "A New Architecture for High Speed, Low Latency NB-LDPC Check Node Processing", IEEE International Symposium on Personal, Indoor and Mobile Radio Communications, Aug. 2015.

Rybalkin, V., Schlafer, P., and Wehn, N. "A New Architecture for High Speed, Low Latency, NB-LDPC Check Node Processing for GF(256)", IEEE 83rd Vehicular Technology Conference (VTC Spring) Nanjing, pp. 1-5, 2016.

Lacruz, J, Garcia-Herrero, F., Valls, J. and Declercq, D. "One Minimum Only Trellis Decoder for Non-Binary Low-Density Parity-Check Codes", IEEE Transactions on Circuits and Systems I. Regular Papers, vol. 62, No. 1, Jan. 2015.

Schlafer, P., Wehn, N., Alles, M., Lehnigk-Emden, T., and Boutillon, E. "Syndrome Based Check Node Processing of High Order NB-LDPC Decoders", 22nd International Conference on Telecommunications, pp. 156-162, Apr. 2015.

M. Davey and D. MacKay, "Low-density parity check codes over GF (q)", IEEE Communications Letters, vol. 2, No. 6, pp. 165-167, Jun. 1998.

D.J.C. Mackay and M. Davey, "Evaluation of Gallager Codes for Short Block Length and High Rate Applications", Proceedings of IMA Workshop on Codes, Systems and Graphical Models, 1999.

International Search Report and Written Opinion for PCT/EP2018/064994, dated Aug. 20, 2018.

Schläfer Philipp et al, "Syndrome based check node processing of high order NB-LDPC decoders", Proc., IEEE 22nd International Conference On Telecommunications, ICT 2015,Apr. 27, 2015 (Apr. 27, 2015), p. 156-162.

Cédric Marchand et al, "NB-LDPC check node with pre-sorted input NB-LDPC check node with pre-sorted input", Sep. 16, 2016 (Sep. 16, 2016), p. 1-6.

Oussama Abassi et al, "A Novel Architecture for Elementary-Check-Node Processing in Nonbinary LDPC Decoders", IEEE Transactions On Circuits and Systems II: Express Briefs,vol. 64, No. 2, Feb. 1, 2017 (Feb. 1, 2017), p. 136-140.

* cited by examiner

SIMPLIFIED CHECK NODE PROCESSING IN NON-BINARY LDPC DECODER

TECHNICAL FIELD

The invention generally relates to digital communications, and in particular to methods and devices for decoding a signal encoded using an error correcting code.

BACKGROUND

Error correcting codes are efficient tools implemented in various transmission or storage devices and systems for providing a protection of data against errors that may occur during data transmission or storage. Data errors can originate from noise and/or interference. Error correcting codes enable a protection of data against such errors through the addition of redundant data to the original data.

Systems and devices implementing error correcting codes are used in a wide range of applications such as voice and multimedia transfer for example in wireless communications (e.g. standardized in Wi-Fi 802.11), in radio communications (e.g. standardized in 3G, 4G/LTE, 5G and beyond, etc), in optical communication systems, and in digital video broadcasting (e.g. standardized in DVB-C2, DVB-S2X, DVB-T2, etc) and in storage systems such as hard disc drives and solid state memories.

Among the existing error correcting codes, linear block codes are widely used given that they are less complex and easier to implement than the non-linear codes such as convolutional codes. The linearity property guarantees that any linear combination of codeword vectors is a codeword vector. Exemplary linear block codes comprise Hamming codes, Reed-Solomon codes, Turbo codes, polar codes, and Low-Density Parity-Check (LDPC) codes.

LDPC codes are very efficient linear block codes that can provide high transmission rates that approach the optimum channel capacity, i.e. the theoretical maximum amount of information that can be transmitted over a communication channel. In particular, non-binary LDPC codes are very efficient in providing high-spectral efficiency coding and can achieve better error-correction performance than binary LDPC codes.

Decoding of signals that are encoded using linear error-correcting codes can be performed based on a graph representation of the code, so-called 'Tanner graph'. The Tanner graph comprises two sets of nodes linked together by edges. The first set of nodes is referred to as 'variable nodes'. The second set of nodes is referred to as 'check nodes'. Variable nodes and check nodes form processing units, referred to as 'variable node processing units' and 'check node processing units', respectively.

The Tanner graph can be used to implement iterative decoding of signals that are encoded using linear error correcting codes. Accordingly, the decoding process can be performed by an iterative exchange of messages between the variable node processing units and the check node processing units. Each variable node processing unit (respectively check node processing unit) receives check node messages (respectively variable node messages) from the corresponding connected nodes in the Tanner graph. After processing the received check node messages (respectively variable node messages), each variable node processing unit (respectively check node processing unit) delivers a variable node message (respectively a check node message) to at least one check node processing unit (respectively variable node processing unit) corresponding to a connected node in the Tanner graph. Each variable node processing unit also receives intrinsic information and computes local decisions. The local decisions may be used to verify the parity-check constraints. The message exchanges continue until either all parity-check constraints designed to be satisfied by the error correcting code are met, returning thus the decoded codeword vector, or when reaching a maximum number of iterations without meeting all parity-check constraints.

First iterative decoding algorithms were designed for binary codes and apply to binary LDPC codes. They are the 'sum-product' algorithms (also known as 'belief propagation' or 'message passing' algorithms) and the 'min-sum' algorithm disclosed both in "N. Wibereg, H-A. Loeliger, and R. Kotter, Codes and Iterative Decoding on General Graphs, European Transactions on Telecommunications and Related Technologies, special issue on Turbo Coding, June 1995". They provide near-optimal performance in terms of error decoding probability.

Iterative decoding algorithms, designed for non-binary codes, were inspired by the 'sum-product' algorithm. Exemplary iterative decoders for non-binary codes comprise the 'q-ary sum-product' algorithm, disclosed for example in:

"M. Davey and D. MacKay, Low-density parity check codes over GF(q), IEEE Communications Letters, vol. 2, no. 6, pages 165-167, June 1998", "D. J. C. Mackay and M. Davey, Evaluation of Gallager Codes for Short Block Length and High Rate Applications, In Proceedings of IMA Workshop on Codes, Systems and Graphical Models, 1999", and "L. Barnault and D. Declercq, Fast decoding algorithm for LDPC over GF(q), In Proceedings of IEEE Information Theory Workshop, pages 70-73, April 2003".

Some iterative decoding algorithms are based on logarithmic-scale computations for reducing the computational complexity by transforming product operations to simple summation operations. Such decoding schemes comprise:

the 'extended min-sum' (EMS) non-binary LDPC codes decoder disclosed in "D. Declercq and M. Fossorier, Decoding algorithms for non-binary LDPC codes over GF, IEEE Transactions on Communications, vol, 55, no. 4, pages 633-643, April 2007";

the 'min-max' non-binary LDPC codes decoder disclosed in "V. Savin, Min-max decoding for non-binary LDPC codes, In Proceedings of IEEE International Symposium on Information Theory, pages 960-964, July 2008", and the 'Trellis EMS decoder' disclosed for examples in "J. O. Lacruz, F. Garcia-Herrero, J. Valls and D. Declercq, One Minimum Only Trellis Decoder for Non-Binary Low-Density Parity-Check Codes, in IEEE Transactions on Circuits and Systems I: Regular Papers, vol. 62, no. 1, pages 177-184, January 2015" and "E. Li, F. Garcia-Herrero, D. Declercq, K. Gunnam, J. O. Lacruz and J. Valls, "Low latency T-EMS decoder for non-binary LDPC codes," 2013 Asilomar Conference on Signals, Systems and Computers, Pacific Grove, C A, 2013, pp. 831-835".

The EMS algorithm is based on log-domain computations of the exchanged messages between the variable node processing units and the check node processing units. As the largest complexity of the EMS algorithm is the computation performed by the check node processing units, the EMS algorithm applies a sorting and truncation of processed variable node messages to further alleviate the computational complexity and memory requirements at check node processing units.

The computation of check node messages at the level of the check node processing units from the sorted and truncated variable node messages can be performed according to various architectures. Existing architectures include "forward-backward" architectures and "syndrome-based" architectures.

In a "forward-backward" architecture, the computations performed by a check node processing unit are divided up into multiple elementary calculations involving multiple elementary check node processing units (hereinafter referred to as 'elementary check node processors'). Each elementary check node processor processes two or more variable node messages to generate an intermediate message that is subsequently used by remaining elementary check node processors, at later stages. Exemplary algorithms for elementary check node processing comprise:

the 'Bubble check' algorithm disclosed in "E. Boutillon and L. Conde-Canencia, Bubble check: a simplified algorithm for elementary check node processing in extended min-sum non-binary LDPC decoders, Electronics Letters, vol. 46, no. 9, pp. 633-634, April 2010", and an improved version of the 'Bubble check' algorithm known as 'L-Bubble check' disclosed "E. Boutillon, L. Conde-Canencia, and A. Al Ghouwayel, Design of a GF(64)-LDPC Decoder based on the EMS algorithm, IEEE Transactions on Circuits and Systems, vol. 60, no. 10, pages 2644-2656, October 2013".

In a syndrome-based architecture, a check node processing unit implements a syndrome-based decoding. The computation of check node messages from the sorted and truncated variable node messages requires two steps. At a first step, the check node processing unit computes a set of values termed 'syndromes' involving all variable node messages. At a second step, a decorrelation operation is performed in association with each check node message. The decorrelation operation consists in cancelling, from the computed syndromes, the contribution of the variable node message previously received from the variable node processing unit that is configured to receive the computed check node message. The syndrome-based architecture is disclosed for instance in:

"P. Schlafer, N. When, M. Alles, T. Lehnigk-Emden, and E. Boutillon, Syndrome based check node processing of high order NB-LDPC decoders, In Proceedings of the International Conference on Telecommunications, pages 156-162, April 2015";

"P. Schlafer, et al., A new Architecture for High Speed, Low Latency NB-LDPC Check Node Processing, In Proceedings of IEEE International Symposium on Personal, Indoor and Mobile Radio Communications, August 2015"; and "V. Rybalkin, P. Schlafer and N. Wehn, A New Architecture for High Speed, Low Latency NB-LDPC Check Node Processing for GF(256), In Proceedings of IEEE 83rd Vehicular Technology Conference (VTC Spring), Nanjing, pages 1-5, 2016".

The forward-backward architecture allows a reduction of the hardware cost. However, it introduces high latency resulting in a degradation in the system throughput.

The syndrome-based architecture introduces high complexity mainly due to the number of computed syndromes that increases with the number of variable node messages. The implementations of the syndrome-based architecture in practical decoding systems require significant computational and storage resources that are not always available. In particular, some practical implementations of this architecture are not adapted to the decoding of non-binary codes having high coding rates.

There is accordingly a need for developing more efficient and lower complexity architectures for check node processing units implemented in an EMS decoder in particular, and in any Tanner graph-based iterative decoder in general.

SUMMARY

In order to address these and other problems, there is provided a decoder for determining an estimate of a signal encoded using at least one error correcting code. The decoder comprises at least one check node processing unit configured to receive at least three variable node messages from one or more variable node processing units and to determine one or more check node messages. The at least one check node processing unit comprises at least two blocks of sub-check nodes, each block of sub-check nodes is configured to:

determine a set of sub-check node syndromes from at least one variable node message among the at least three variable node messages; and determine at least one check node message from at least one syndrome.

According to some embodiments, the decoder may comprise at least one message presorting unit configured to determine permuted variable node messages by applying one or more permutations to the at least three variable node messages, each block of sub-check node being configured to determine a set of sub-check node syndromes from at least one permuted variable node message of the determined permuted variable node messages.

According to some embodiments, at least one check node processing unit may comprise at least two blocks of sub-check nodes, at least one block of sub-check node implementing a syndrome sub-check node architecture and at least one block of sub-check node implementing a forward-backward architecture.

According to some embodiments, the decoder may comprise a block division unit configured to perform a division of the check node processing unit into at least two blocks of sub-check nodes using a set of block division parameters.

According to some embodiments, a set of block division parameters may be determined in association with each check node processing unit and may comprise at least:

a first block division parameter representing at least two blocks of sub-check nodes comprised in the at least one check node processing unit, and a second block division parameter representing at least one variable node message.

According to some embodiments, the block division unit may be configured to determine a same set of block division parameters in association with each check node processing unit.

According to other embodiments in which the decoder comprises at least two check node processing units, the block division unit may be configured to determine a set of block division parameters in association with each of said at least two check node processing units, the set of block division parameters comprising at least a block division parameter for one of the at least two check node processing units that is different from another block division parameter for another of the at least two check node processing units.

According to some embodiments, the decoder may be configured to determine, from at least one check node message, an estimate of a signal encoded using at least one error correcting code. Each check node processing unit may be configured to send at least one check node message to one or more variable node processing units during a number of iterations. The block division unit may be configured to determine a set of block division parameters in association with at least one check node processing unit depending on at least one parameter chosen in a group comprising one of a signal-to-noise ratio, an algebraic structure of construction of the at least one error correcting code, the at least three variable node messages, and the number of iterations.

According to some embodiments, a syndrome may comprise a symbol and a reliability metrics associated with this symbol, each block of sub-check node being configured to determine a set of sub-check node syndromes comprising syndromes at least partially sorted into a given order of the reliability metrics associated with the symbols.

In some embodiments, each variable node message may comprise one or more variable node components. Each variable node component may comprise a symbol and a reliability metrics associated with the symbol. Each variable node message may be sorted into a given order of the reliability metrics comprised in the one or more variable node components. The at least one check node processing unit may further comprise a syndrome calculation unit configured to determine a set of syndromes from one or more of the sub-check node syndromes, a sub-check node comprising:

a calculation unit configured to determine a set of sub-check node syndromes from the variable node components, a symbol of a syndrome being determined from the symbols comprised in the variable node components, and the reliability metrics associated with the determined symbol being determined from the reliability metrics comprised in the variable node components;

a processing unit configured to receive the set of syndromes determined by the syndrome calculation unit and to determine the at least one check node message from said set of syndromes. A check node message may comprise one or more check node components. A check node component may comprise a symbol and a reliability metrics associated with the symbol. The one or more check node components may comprise distinct symbols.

According to some embodiments, the calculation unit may be configured to determine the set of sub-check node syndromes using at least one elementary check node processor. An elementary check node processor may be configured to determine an intermediate message from a first message and a second message, the first message and second message being derived from the at least one variable node message. An intermediate message may comprise one or more intermediate components and an intermediate binary vector in association with each intermediate component. Each intermediate component may comprise a symbol and a reliability metrics associated with said symbol. The one or more intermediate components may be sorted according to an order of the reliability metrics associated with the symbols and may comprise one or more intermediate components comprising a same symbol. The at least one elementary check node processor may be configured to determine a set of sub-check node syndromes from the intermediate message determined from all variable node messages.

According to some embodiments, the calculation unit of at least one block of sub-check node may comprise at least two elementary check node processors implemented in a serial architecture.

According to some embodiments, the calculation unit of at least one block of sub-check node may comprise at least two elementary check node processors implemented in a tree architecture.

According to some embodiments, the calculation unit of at least one block of sub-check node may comprise at least two elementary check node processors implemented in a hybrid architecture, the hybrid architecture comprising at least one elementary check node processor implemented in a serial architecture and at least one elementary check node processor implemented in a tree architecture.

According to some embodiments, the calculation unit may comprise at least one elementary check node configured to determine an intermediate message from a first message and a second message, the first message and second message being derived from the at least one variable node message. The intermediate message may comprise one or more intermediate components and an intermediate binary vector in association with each intermediate component, the one or more intermediate components being sorted according to an order of the reliability metrics associated with the symbols and comprising distinct symbols. The calculation unit may be configured to determine the set of sub-check node syndromes from the intermediate message determined from all of said at least one variable node message.

According to some embodiments, the at least one error correcting code may be a non-binary error correcting code.

There is also provided a decoding method comprising:
receiving at least three variable node messages;
determining at least two sets of sub-check node syndromes, each set of sub-check node syndromes being determined from at least one variable node message among the received at least three variable node messages; and
determining at least one check node message from at least one syndrome.

Advantageously, the block division of check node processing units according to the various embodiments enables a computation of syndromes by blocks of syndromes, a block comprising one or more syndromes, allowing a significant reduction of the computational complexity involved in the computation of the syndromes.

Advantageously, the block computation of syndromes in the blocks of sub-check nodes using elementary check node processors according to some embodiments provides a low-complexity and low-latency architecture for check node processing taking advantage of the parallelism of syndrome decoding and the linear complexity of elementary check node processing. Such a combination of syndrome decoding with elementary check node processing allows a reduction in the costs of the hardware implementation of check node processing units.

Further advantages of the present invention will become clear to the skilled person upon examination of the drawings and the detailed description, provided for illustration purposes only.

BRIEF DESCRIPTION OF THE DRAWINGS

The accompanying drawings, which are incorporated in and constitute a part of this specification, illustrate various embodiments of the invention, together with the general description of the invention given above and the detailed description of the embodiments given below.

DETAILED DESCRIPTION

Embodiments of the present invention provide devices, methods, and computer program products for decoding a signal encoded using at least one error correcting code with a reduced computational complexity and reduced latency. In particular, they provide efficient architectures for check node processing units implemented in iterative decoders used to decode signals encoded using at least one non-binary error correcting code.

Methods, devices and computer program products according to the various embodiments may be implemented in several types of digital data transmission and storage devices and systems used in various types of applications. Exemplary devices and systems comprise computers, disks, laptops, phones, smartphones, recorders, base stations, drones, satellites, etc. Exemplary applications comprise magnetic and optical recording, digital television and video broadcasting, digital communications, etc.

The following description of some embodiments of the invention will be made with reference to digital communication systems, for illustration purpose only. However, the skilled person will readily understand that the various embodiments of the invention may be integrated in other types of systems used for other applications such as positioning systems and spacecraft systems.

Figure 1:
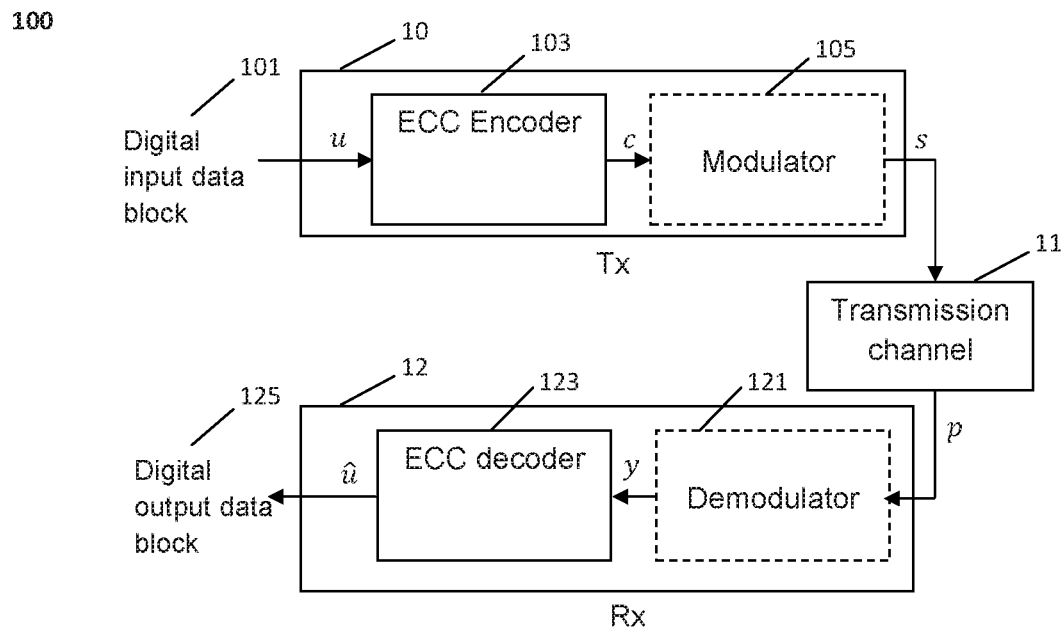
FIG. 1 is a block diagram of an exemplary application of the invention to communication systems, according to some embodiments.

Referring to FIG. 1, there is illustrated an exemplary application of the invention in a digital communication system 100. The communication system 100 may be for example:

wired;

wireless (e.g. radio or Visible Light communication systems);

optical (e.g. optical fiber-based);

acoustic (e.g. underwater acoustic communication systems);

molecular (used for example in underground structures, e.g. tunnels and pipelines or in underwater environments).

The communication system 100 may comprise at least a transmitter device 10 and a receiver device 12. The transmitter device 10 (also referred to hereinafter as a "transmitter") is configured to communicate data information to the receiver device 12 (also referred to hereinafter as "receiver") via the transmission channel 11.

In an application of the invention to wired communication systems such as computer networking systems, the transmitter 10 and/or receiver 12 may be any device configured to operate in a wired network. Exemplary devices in such applications comprise computers, routers or switches connected to a small or large area wired network. The transmission channel 11 may be in this case any type of physical cable used to ensure the transfer of data between the different connected devices.

In an application of the invention to wireless communication systems such as ad-hoc wireless networks, wireless sensor networks and radio communication systems, the transmitter 10 and receiver 12 may be any type of fixed or mobile wireless device configured to operate in a wireless environment. Exemplary devices in such applications comprise laptops, mobile phones and base stations. The transmission channel 11 may be in this case any wireless propagation medium. Further, the transmission channel 11 may accommodate several transmitters 10 and/or several receivers 12. In such embodiments, multiple access techniques and/or network coding techniques may be used in combination with error correcting codes. Exemplary multiple access techniques comprise Time Division Multiple Access (TDMA), Frequency Division Multiple Access (FDMA), Code Division Multiple Access (CDMA), and Space Division Multiple Access (SDMA).

In an application of the invention to optical communication systems such as optical fiber-based systems, the transmitter 10 and receiver 12 may be any optical transceiver device configured to respectively transmit and receive data information propagated over an optical link. The transmission channel 11 may be any optical fiber link designed to carry data over short or long distances. Exemplary applications using optical fiber links over short distances comprise high-capacity networks such as data center interconnections. Exemplary applications using optical fiber links over long distances comprise terrestrial and transoceanic transmissions. In such embodiments, the information symbols conveyed by the transmitter 10 may be carried by optical signals polarized according to the different polarization states of the fiber. The optical signals propagate along the fiber-based transmission channel 11, according to one or more propagation modes, until reaching the receiver 12. Exemplary optical communication systems comprise Polarization Division Multiplexing (PDM) and Mode Division Multiplexing (MDM) systems.

For any type of wired, wireless or optical communication systems, the transmission channel 11 may be any noisy channel. The noise may result from the thermal noise of the system components or the interfering radiation intercepted by antennas. Other exemplary sources of noise comprise switching, manual interruptions, electrical sparks and lightning. In some embodiments, the total noise may be modeled by an additive white Gaussian noise (AWGN).

Further, according to some embodiments in application to digital mass storage, the transmission channel 11 may be modeled for example by an erasure channel, a binary symmetric channel, or a Gaussian channel. In such embodiments, the transmission channel 11 may be any type of storage device that can be sent to (written on) and/or received from (read).

In addition, the transmitter 10 and receiver 12 may be equipped with single or multiple antennas. In particular, in the presence of multiple transmit and/or receive antennas, Space-Time coding and decoding techniques may be used in combination with error correcting coding and decoding.

Further, encoded data may be transmitted over one or multiple frequency bands. When encoded data are transmitted over multiple frequency bands, the modulator 105 may use multi-carrier modulation formats such as OFDM (acronym for Orthogonal Frequency Division Multiplexing) and FBMC (Filter Bank Multi-Carrier).

According to some embodiments of the invention, the transmitter 10 may comprise an error correcting code (ECC) encoder 103, configured to encode a digital input data block 101 denoted by u using a linear block error correcting code into a codeword vector denoted by c. The receiver 12 may be configured to receive a noisy copy p of the encoded data, or codeword vector, through the transmission channel 11. The receiver 12 may comprise an error correcting code decoder 123 configured to deliver a digital output data block 125 as an estimate û of the original digital input data block 101.

The digital input data 101 may be previously compressed before being encoded by the ECC encoder 103. Any source coding scheme (not shown in FIG. 1) adapted to increase the information throughput may be used to perform the compression. Data encoded by the ECC encoder 103 may be further modulated by a modulator 105. The modulator 105 may be configured to map the encoded data onto an analog signal s and to send it through the transmission channel 11.

The receiver 12 may comprise homologous processing means configured to perform the reverse functions. It may comprise a demodulator 121 configured to generate a signal y by performing a demodulation of the received signal p from the transmission channel prior to ECC decoding by the ECC decoder 123. The demodulator 121 may be configured to move the received signal or channel output back into baseband and perform low-pass filtering, sampling and quantization. The data decoded by the ECC decoder 123 may be further decompressed using any source decoder (not shown in FIG. 1). The ECC decoder 123 may be configured to implement an iterative decoder (referred to as 'iterative decoding algorithm') involving a number of check node processing units according to the various embodiments of the invention.

The following description of some embodiments of the invention will be made with reference to linear block error correcting codes, for illustration purpose only. However, the skilled person will readily understand that the various embodiments of the invention apply to any linear codes comprising the convolutional codes and in general to any error correcting codes.

Accordingly, the ECC encoder 103 may implement a linear block error correcting code designated by (n, K); n and K referring respectively to the length of codeword vectors and the length of the encoded data block. The ECC encoder 103 encodes accordingly a message vector u of length K into a codeword vector c, c being a vector of length n. The codeword c therefore comprises n elements, also referred to as "symbols". For example, in embodiments in which systematic codes are used, among the n symbols, n−K symbols correspond to redundancy symbols, also called 'parity symbols'. The function of the parity symbols is to allow the receiver 12 to detect and possibly correct any error that occurred during the transmission.

A linear code $\mathcal{C}$ (n, K) may be represented in a matrix form using a generator matrix denoted by G and a parity-check matrix denoted by H. Using a row notation of vectors, the generator matrix G is of dimensions K×n while the parity-check matrix has dimensions of (n−K)×n. The two matrices are linked by the relation $G \cdot H^t = 0$. In addition, entries of both matrices belong to the algebraic structure over which the error correcting code is constructed. Using the matrix representation, any codeword vector c satisfies the equation $c \cdot H^t = 0$. This equation is also called "parity-check equation". It defines n−K parity-check constraints designed to be satisfied by any codeword vector.

In association with the matrix representation, the linear code $\mathcal{C}$ (n,K) may be represented using a bipartite graph $\mathcal{H}$ termed "Tanner graph". This graph comprises n variable nodes and n−K check nodes.

Each variable node $vn \in \{1, 2, \ldots, n\}$ corresponds to a column of the parity-check matrix. Each check node $cn \in \{1, 2, \ldots, n-K\}$ corresponds to a row of the parity-check matrix, i.e. to a parity-check equation. A variable node vn is connected to a check node cn if the entry $H_{vn,cn}$ of the parity-check matrix is not equal to zero, i.e. if $H_{vn,cn} \neq 0$.

$\mathcal{H}_v(vn)$ denotes the set of the check nodes connected to the variable node vn. Similarly, $\mathcal{H}_c(cn)$ denotes the set of the variable nodes connected to the check node cn.

The degree of a variable node vn (respectively a check node cn) corresponds to the cardinality of the set $\mathcal{H}_v(vn)$ (respectively the cardinality of the set $\mathcal{H}_c(cn)$).

According to some embodiments, the algebraic structure of construction of the error correcting code may be any non-zero commutative division ring such as fields. Exemplary fields comprise the field of real numbers, the field of complex numbers, the field of rational numbers, and finite fields (also known as 'Galois fields').

The following description of some embodiments will be made with reference to finite fields, for illustration purposes only. However the skilled person will readily understand that the invention may be applied to any division rings-like algebraic structures such as non-zero commutative division rings and to any near-rings such as finite division near-rings. Insights on the design of non-binary error correcting codes over finite division near-rings can be found in the article "Non-binary LDPC codes over finite division near rings," 2016 23rd International Conference on Telecommunications (ICT), Thessaloniki, 2016, pp. 1-7".

For linear codes constructed over Galois Fields, generally denoted by GF(q), where $q \geq 2$ designates the cardinality of the code, the symbols take values in GF(q). A codeword vector c is thus a vector of n symbols that belong each to GF(q). The code is binary if the symbols belong to GF(2). In contrast, when q>2, the code is qualified as non-binary.

The following description of some embodiments will be made with reference to an ECC encoder 103 encoding data using a non-binary LDPC code, for illustration purpose only. However, the skilled person will readily understand that the various embodiments of the invention also apply to other non-binary codes such as non-binary polar codes and in general to binary and non-binary linear block error correcting codes and non-binary turbo codes. Non-binary error correcting codes can advantageously be used for high spectral efficiency coding.

For exemplary purposes, in one embodiment, the ECC decoder 123 implements a non-binary LDPC code decoder for decoding the data encoded by the ECC encoder 103 using a non-binary LDPC code. The ECC decoder 123 may implement any iterative non-binary LDPC code decoder such as the Extended Min Sum algorithm or the min-max algorithm.

According to a particular application to the EMS algorithm, the various embodiments of the invention provide efficient, low-latency, and low-complexity implementations of check node processing units involved in the iterative decoding process using an EMS algorithm. The description of the invention is made with reference to the EMS algorithm. However, the skilled person will readily understand that the various embodiments apply to any iterative non-binary LDPC codes decoder such as the min-max decoding algorithm.

Figure 2:
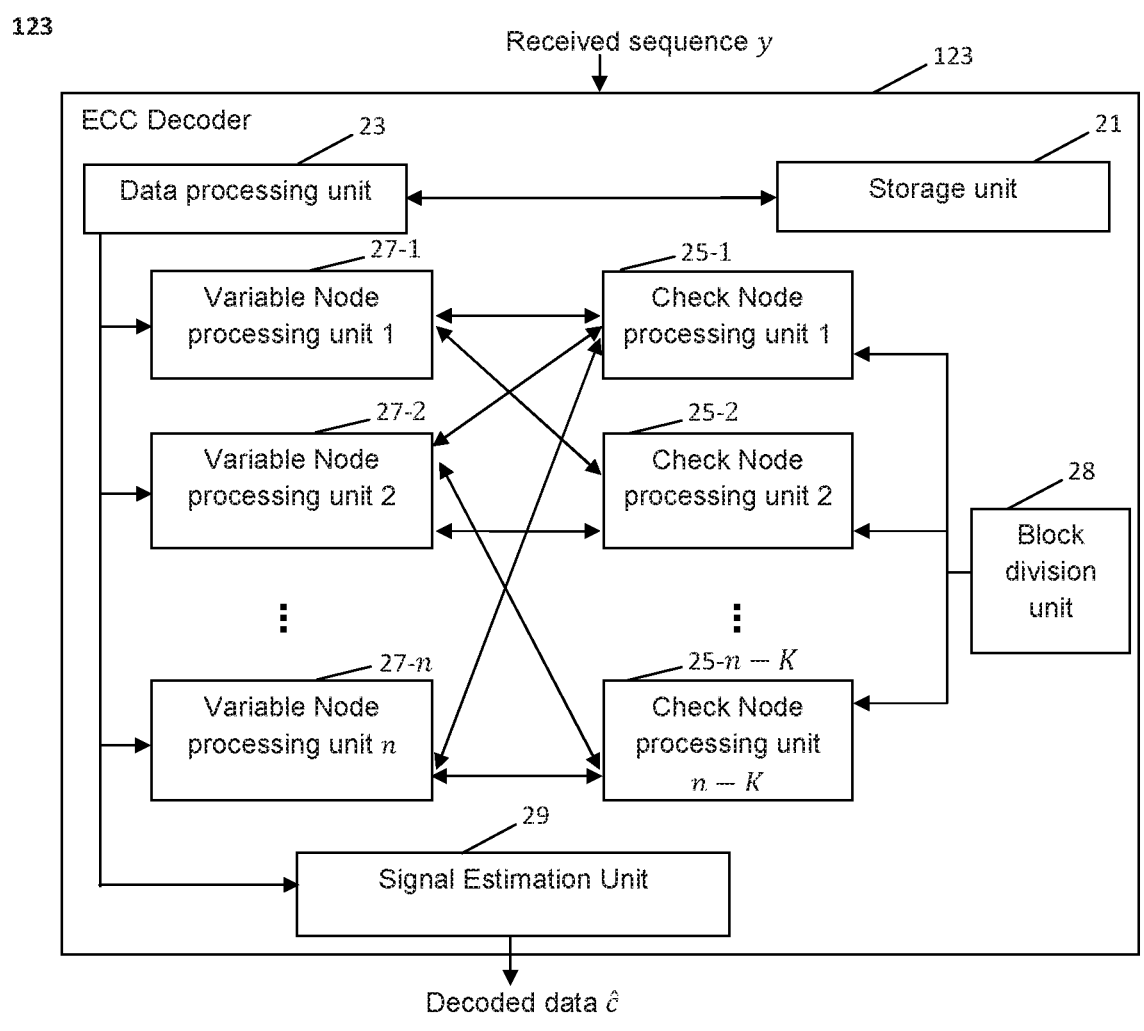
FIG. 2 is a block diagram of an error correcting code decoder, according to some embodiments in which an EMS algorithm is used.

Referring to FIG. 2, there is illustrated a structure of an iterative non-binary LDPC decoder 123 according to some embodiments using the EMS algorithm.

The iterative decoder 123 may be configured to determine an estimate c of the transmitted codeword c by the transmitter 10 from a received noisy sequence y. It may process a signal over several iterations bringing it, at each iteration, closer to the transmitted codeword vector c.

The iterative decoder 123 may be configured to determine the estimate c based on the Tanner graph representation of the code $\mathcal{C}$ (n, K) used at the transmitter 10. Accordingly, the iterative decoder 123 may comprise n variable node processing units 27 (also denoted by 27-1 to 27-n or 27-vn with vn=1, . . . , n) and n–K check node processing units 25 (also denoted by 25-1 to 25-(n–K) or 25-cn with cn=1, . . . , n–K).

Each variable node processing unit 27-vn maps to one variable node in the Tanner graph. Each check node processing unit 25-cn maps to one check node in the Tanner graph. The variable node processing units 27-vn for vn=1, . . . , n and check node processing units 25-cn for cn=1, . . . , n–K may be configured to iteratively exchange messages to estimate the most reliable codeword ĉ from the noisy sequence y.

A variable node processing unit 27-vn corresponding to a variable node vn may be configured to receive intrinsic information from the received sequence y and to receive check node messages from the check node processing units 25-cn corresponding to the set $\mathcal{H}_v$(vn). A variable node processing unit 27-vn may be further configured to process these check node messages, compute local decisions, and deliver variable node messages to at least one check node processing unit 25-cn corresponding to the check nodes in the set $\mathcal{H}_v$(vn).

Similarly, a check node processing unit 25-cn corresponding to a check node cn may be configured to process variable node messages sent by the variable node processing units 27-vn corresponding to the set $\mathcal{H}_c$(cn). A check node processing unit 25-cn may be further configured to deliver check node messages to at least one variable node processing unit 27-vn corresponding to the variable nodes in the set $\mathcal{H}_c$(cn).

The processing performed by the various variable node processing units 27-vn and check node processing units 25-cn may be implemented according to several scheduling mechanisms including, without limitation, the three examples described in the following.

According to a first implementation, all the variable node processing units 27-vn for vn=1, . . . , n, may be configured to operate in a first round and then all the check node processing units 25-cn, for cn=1, . . . , n–K, may be configured to update the check node messages to be sent to the variable node processing units in their corresponding sets $\mathcal{H}_c$(cn). This specific scheduling is known as "flooding scheduling". In particular, the check node processing units 25-cn may be configured to operate serially or in parallel, where from 2 to n–K check node processing units 25-cn may operate at the same time.

According to a second implementation based on a "horizontal scheduling", the check node processing units 25-cn, for cn=1, . . . , n–K, may be configured to operate serially, updating all variable node processing units 27-vn which are connected to them. In particular, a group of check node processing units 25-cn may be configured to operate in parallel, updating all connected variable node processing units 27-vn provided that there is no variable node processing unit 27-vn in conflict (e.g. when two check node processing units 25-cn are connected to the same variable node processing unit 27-vn).

According to a third implementation based on a "vertical scheduling", the variable node processing units 27-vn may be configured to operate serially, updating all check node processing units 25-cn which are connected to them.

The exchange of messages may be started by the variable node processing units 27-vn. It may terminate either if the processed signal satisfies the parity-check equation or if a maximum number of iterations is reached without meeting all parity-check constraints.

Accordingly, the iterative decoder 123 may comprise a signal estimation unit 29 configured to receive, at each iteration of the decoding process, the local decisions computed by the variable node processing units 27-vn and to:
 deliver the processed signal as an estimate of the original codeword vector if the processed signal satisfies the parity-check equation; or
 declare a decoding failure but nevertheless output the codeword vector estimated at the last iteration if a maximum number of iterations is reached without meeting all parity-check constraints.

As illustrated in FIG. 2, the iterative decoder 123 may further comprise a storage unit 21 configured to store the received sequence y. It may also comprise a data processing unit 23 configured to determine initial values of variable node messages to be delivered by the variable node processing units 27-vn based on the received sequence y loaded from the storage unit 21.

The exchanged messages between the variable node processing units 27-vn and the check node processing units 25-cn may carry information representative of the symbols.

According to some embodiments, the length of an exchanged message may be equal to the order of the Galois field used to construct the linear code. Accordingly, each exchanged message may be a vector of length q for codes constructed over GF(q).

In other embodiments related to soft-decision decoding, exchanged messages may carry the values of the symbols and metrics measuring their reliabilities (also referred to hereinafter as 'reliability metrics'). The value of the reliability metrics is related to the reliability of the symbol. In such embodiments, each exchanged message may be a vector comprising q components, a component comprising:
- a value of a symbol in GF(q), and
- a reliability metrics associated with the symbol.

In some embodiments, the reliability metrics of a symbol may correspond to an estimated probability density function of the symbol which represents the probability that the symbol is correct. In particular, the reliability metrics may be represented in the log-domain by a logarithmic likelihood ratio (LLR) value.

According to some embodiments using the EMS algorithm, the variable node messages generated by the variable node processing units 27-$vn$ may be sorted and truncated so as to keep only the $n_{m,in}$ most reliable components, with $n_{m,in}$ being strictly lower than q ($n_{m,in} \ll q$). The sorting may be performed in a given order (for example by increasing or decreasing order) of the reliability metrics associated with the symbols. Further, the sorting and truncation operations may be performed by the variable node processing units 27-$vn$ or by the check node processing unit 25-$cn$ which receives the variable node messages.

The following description will be made with reference to some embodiments using soft-output decoding based on sorting and truncation of the variable node messages sent by the variable node processing units 27-$vn$, for illustration purpose only.

The computational complexity of the iterative decoding process is dominated by the computations performed by the check node processing units 25-$cn$. In one embodiment using the EMS algorithm for decoding non-binary LDPC codes, the computational complexity of the processing performed by the check node processing units 25-$cn$ may be reduced without sacrificing the decoding error performance.

In order to reduce the computational complexity involved in the processing performed at a check node processing unit 25-$cn$, according to the invention, there are provided block division and block decoding techniques enabling respectively the division of a check node processing unit 25-$cn$ into blocks of sub-check nodes and the computation of the check node messages by blocks. Each block of a sub-check node may be configured to receive at least one variable node message and to generate one or more check node messages and one or more syndromes. Different structures or types of sub-check nodes are described further down in the description in relation to the figure that illustrates different architectures in which the invention may be embodied.

Accordingly, the iterative decoder 123 may further comprise a block division unit 28 configured to divide at least one check node processing unit 25-$cn$ for cn=1, . . . , n–K into at least two blocks of sub-check nodes using a set of block division parameters. The block division unit 28 may be accordingly configured to determine a set of block division parameters in association with at least one check node processing unit 25-$cn$ for cn=1, . . . , n–K.

In some embodiments, the block division unit 28 may be configured to divide the at least one check node processing unit 25-$cn$1 into at least two blocks of sub-check nodes of a same type or of a different type, i.e. the architectures implemented in at least two blocks of sub-check nodes may be similar or different.

In some embodiments, the determination of at least one set of block division parameters may be performed in an offline mode for example before the start of the iterative decoding process or the start of the messages exchange between the variable node processing units 27-$vn$ and the check node processing units 25-$cn$.

In other embodiments, the determination of at least one set of block division parameters may be performed online, during the iterative decoding process for example.

In some embodiments of the invention, a set of block division parameters associated with a check node processing unit 25-$cn$ may comprise at least:
- a first block division parameter representing the number of blocks of sub-check nodes comprised in a check node processing unit 25-$cn$. The number of blocks of sub-check nodes may be higher than or equal to two according to which a check node processing unit 25-$cn$ may be divided into at least two blocks of sub-check nodes, and
- a second block division parameter representing at least one variable node message. The second block division parameter represents the number of the variable node messages received and processed by each of the blocks of sub-check nodes comprised in a check node processing unit 25-$cn$ for cn=1, . . . , n–K.

According to some embodiments in which the iterative decoder 123 comprises at least two check node processing units 25-$cn$ for cn=1, . . . , n–K with n–K≥2, the block division unit 28 may be configured to determine a same set of block division parameters in association with each of the at least two check node processing units 25-$cn$. This means that the various first block division parameters associated with each of the at least two check node processing units 25-$cn$ are equal and the various second block division parameters associated each with the at least two check node processing units 25-$cn$ are equal.

In other embodiments in which the iterative decoder 123 comprises at least two check node processing units 25-$cn$ for cn=1, . . . , n–K with n–K≥2, the block division unit 28 may be configured to determine sets of block division parameters, each set being associated with one of the at least two check node processing units 25-$cn$ and said sets of block division parameters comprising at least one different block division parameter. In other words, the sets of block division parameters associated with at least two check node processing units 25-$cn$ may comprise at least one different block division parameter.

According to some embodiments, the block division unit 28 may be configured to determine a set of block division parameters in association with at least one check node processing unit 25-$cn$ for cn=1, . . . , n–K depending on the received variable node messages that will be processed by the check node processing unit 25-$cn$.

For instance, in some embodiments in which a truncation of the variable node messages is applied, the block division unit 28 may be configured to determine a set of block division parameters depending on the number $n_{m,in}$ of components comprised in the received variable node messages.

In another example, the block division unit 28 may be configured to determine a set of block division parameters in association with at least one check node processing unit 25-$cn$ for cn=1, . . . , n–K depending on the degree $d_{cn}$ of the check node processing unit 25-$cn$. Accordingly, the block division unit 28 may be configured to determine a number of blocks of sub-check nodes higher than or equal to two in association with check node processing units 25-$cn$ of degrees higher than or equal to three, enabling a simplification of the computation of the check node messages both in terms of the required computational operations and latency. For example, the block division unit 28 may be configured to divide a check node processing unit 25-$cn$ of degree $d_{cn}=12$ into four blocks of sub-check nodes, each block receiving three variable node messages.

Further, according to some embodiments, the block division unit 28 may be configured to determine a set of block division parameters in association with at least one check node processing unit 25-*cn* depending on at least one parameter chosen in a group comprising one of a signal-to-noise ratio, the algebraic structure of construction of the used error correcting code $\mathcal{C}$ (n, K), and the number of iterations of the exchange of messages between the variable node processing units 27-*vn* and the check node processing units 25-*cn*.

For example, the block division unit 28 may be configured to determine a first block division parameter, i.e. the number of blocks of sub-check nodes into which a given check node processing unit 25-*cn* may be divided, depending on the order of the Galois Field. Decoding of signals encoded using codes constructed over high order Galois Fields may require a large number of blocks in order to divide the intensive computation of the check node messages into a per-block computation involving lower computational and storage resources.

Given the determined set of block division parameters, the processing and calculation of check node messages at the level of a check node processing unit 25-*cn* may be performed by the divided blocks of sub-check nodes, enabling a significant complexity reduction.

According to some embodiments, a block of sub-check node may be further divided into sub-blocks of processing units implementing each a bloc decoding and computation of at least one check node message.

The following description of some embodiments will be made with reference to a block division of a check node processing unit 25-*cn* with cn varying between 1 and n−K, for illustration purpose only. Further, in order to facilitate the understanding of the following description of some embodiments, a notation at the level of a check node processing unit 25-*cn* will be used in the following. The degree of the check node processing unit 25-*cn* is denoted by $d_{cn}$, i.e. the corresponding check node in the Tanner graph $\mathcal{C}$ is connected to $d_{cn}$ variable nodes which constitute the set $\mathcal{H}_c(cn)$. Advantageously, the degree of the check node processing unit 25-*cn* may satisfy $d_{cn} \geq 3$.

The variable node messages sent by the variable node processing units 27-*vn* associated with the nodes in the set $\mathcal{H}_c(cn)$ are denoted by $U_1, U_2, \ldots, U_{d_{cn}}$. The check node messages generated by the check node processing unit 25-*cn* to the variable node processing units 27-*vn* in the set $\mathcal{H}_c(cn)$ are denoted by $V_1, V_2, \ldots, V_{d_{cn}}$.

A check node equation of degree $d_{cn}$ in GF(q) may be defined, in association with the check node processing unit 25-*cn*, by:

$$e_1 \oplus e_2 \oplus \ldots \oplus e_{d_{cn}} = 0 \quad (1)$$

In equation (1), the vectors $e_i$, for $i=1, \ldots, d_{cn}$, designate variables and the operator $\oplus$ designates the addition operator in the Galois Field.

Moreover, the following notations related to the block division of the check node processing unit 25-*cn* will be used in the following description:

$N_B$: refers to the first block division parameter associated with the check node processing unit 25-*cn*. It designates the number of blocks of sub-check nodes comprised in the check node processing unit 25-*cn*, i.e. the check node processing unit 25-*cn* may be divided into $N_B$ blocks of sub-check nodes, advantageously at least equal to two, $N_B \geq 2$;

S-CN$^{(k)}$: designates the $k^{th}$ block of sub-check node, for $k=1, \ldots, N_B$;

$l^{(k)}$ for $k=1, \ldots, N_B$: refers to the second block division parameter. It designates the number of variable node messages received and processed by the block of sub-check node (also referred to as 'a check node block') S-CN$^{(k)}$ of index k for $k=1, \ldots, N_B$. For a check node processing unit 25-*cn* of a degree $d_{cn}$, the second block division parameter $l^{(k)} \geq 1$, $k=1, \ldots, N_B$ satisfies $\Sigma_{k=1}^{N_B} l^{(k)} = d_{cn}$. The second block division parameter may be advantageously equal to at least two, $l^{(k)} \geq 2$, $k=1, \ldots, N_B$;

$S^{(k)}$ designates the syndromes determined by the block of sub-check S-CN$^{(k)}$ of index k for $k=1, \ldots, N_B$, also referred to as 'sub-check node syndromes'. A syndrome comprises a symbol, a reliability metrics associated with the symbol, and may comprise, in some embodiments, a binary vector;

$NS^{(k)}$ designates the number of syndromes comprised in the sub-check node syndromes $S^{(k)}$;

$\overline{S}^{(k)}$ designates a set of syndromes determined from the sub-check node syndromes received by the block of sub-check node S-CN$^{(k)}$ of index k for $k=1, \ldots, N_B$ and previously calculated by at least one of the remaining blocks of sub-check nodes S-CN$^{(a)}$ for $a \neq k$ and varying between 1 and $N_B$, according to some embodiments;

$$U_{\Sigma_{a=1}^{k-1} l^{(a)}+1}, \ldots, U_{\Sigma_{a=1}^{k} l^{(a)}}$$

designate the $l^{(k)} \geq 1$ variable node messages received and processed by the block of sub-check node S-CN$^{(k)}$ of index $k=2, \ldots, N_B$. For the block of sub-check node S-CN$^{(1)}$ of index $k=1$, the received variable node messages are denoted by $U_1, \ldots, U_{l^{(1)}}$;

$$V_{\Sigma_{a=1}^{k-1} l^{(a)}+1}, \ldots, V_{\Sigma_{a=1}^{k} l^{(a)}}$$

designate the $l^{(k)} \geq 1$ check node messages delivered by the block of sub-check node S-CN$^{(k)}$ of index k for $k=2, \ldots, N_B$. Similarly, for the block of sub-check node S-CN$^{(1)}$ of index $k=1$, the delivered check node messages are denoted by $V_1, \ldots, V_{l^{(1)}}$;

Each variable node message $U_{i(k)}$ received by the block of sub-check node S-CN$^{(k)}$ of index k, with $i(k) = \Sigma_{a=1}^{k-1} l^{(a)} + 1, \ldots, \Sigma_{a=1}^{k} l^{(a)}$, is a vector comprising $n_{m,in}$ variable node components of a one-column vector representation given by:

$$U_{i(k)} = \begin{pmatrix} U_{i(k)}[n_{m,in}-1] \\ \vdots \\ U_{i(k)}[1] \\ U_{i(k)}[0] \end{pmatrix} \quad (2)$$

A variable node component $U_{i(k)}[j] = (U_{i(k)}^{\oplus}[j], U_{i(k)}^{+}[j])$ for $j=0, \ldots, n_{m,in}-1$ comprises a symbol denoted by $U_{i(k)}^{\oplus}[j]$ and the reliability metrics associated with this symbol denoted by $U_{i(k)}^{\oplus}[j]$. The components of each variable node message may be sorted such that the component comprising the most reliable symbol corresponds to the component $U_{i(k)}[0]$, for $i(k) = \Sigma_{a=1}^{k-1} l^{(a)} + 1, \ldots, \Sigma_{a=1}^{k} l^{(a)}$ and that $U_{i(k)}^{+}[j+1] \geq U_{i(k)}^{+}[j]$ for $j=0, \ldots, n_{m,in}-2$.

Similarly, each check node message $V_{i(k)}$ generated by the block of sub-check node S–CN$^{(k)}$ of index k, with $i(k)=\Sigma_{a=1}^{k-1}l^{(a)}+1, \ldots, \Sigma_{a=1}^{k}l^{(a)}$, is a vector comprising $n_{m,out}$ check node components of a one-column vector representation given by:

$$V_{i(k)} = \begin{pmatrix} V_{i(k)}[n_{m,out}-1] \\ \vdots \\ V_{i(k)}[1] \\ V_{i(k)}[0] \end{pmatrix} \quad (3)$$

A check node component $V_{i(k)}[j]$ ($V_{i(k)}^{\oplus}[j], V_{i(k)}^{+}[j]$) for $j=0, \ldots, n_{m,out}-1$ comprises a symbol denoted by $V_{i(k)}^{\oplus}[j]$ and the reliability metrics associated with this symbol denoted by $V_{i(k)}^{+}[j]$. The components of each check node message may be sorted such that the component comprising the most reliable symbol corresponds to the component $V_{i(k)}[0]$, for $i(k)=\Sigma_{a=1}^{k-1}l^{(a)}+1, \ldots, \Sigma_{a=1}^{k}l^{(a)}$ and that $V_{i(k)}^{+}[j+1] \geq V_{i(k)}^{+}[j]$ for $j=0, \ldots, n_{m,out}-2$.

According to some embodiments, the variable node processing unit 27-*cn* may be configured to send the computed local decisions to the signal estimation unit 29. The signal estimation unit 29 may be configured to:
deliver the processed signal as an estimate of the original codeword if the processed signal satisfies the parity-check equation; or
declare a decoding failure but nevertheless output the codeword estimated at the last iteration if a maximum number of iterations is reached without meeting all parity-check constraints.

The decoding process may continue if a maximum number of iterations is not yet reached while the parity-check equation is not satisfied.

Figure 3:
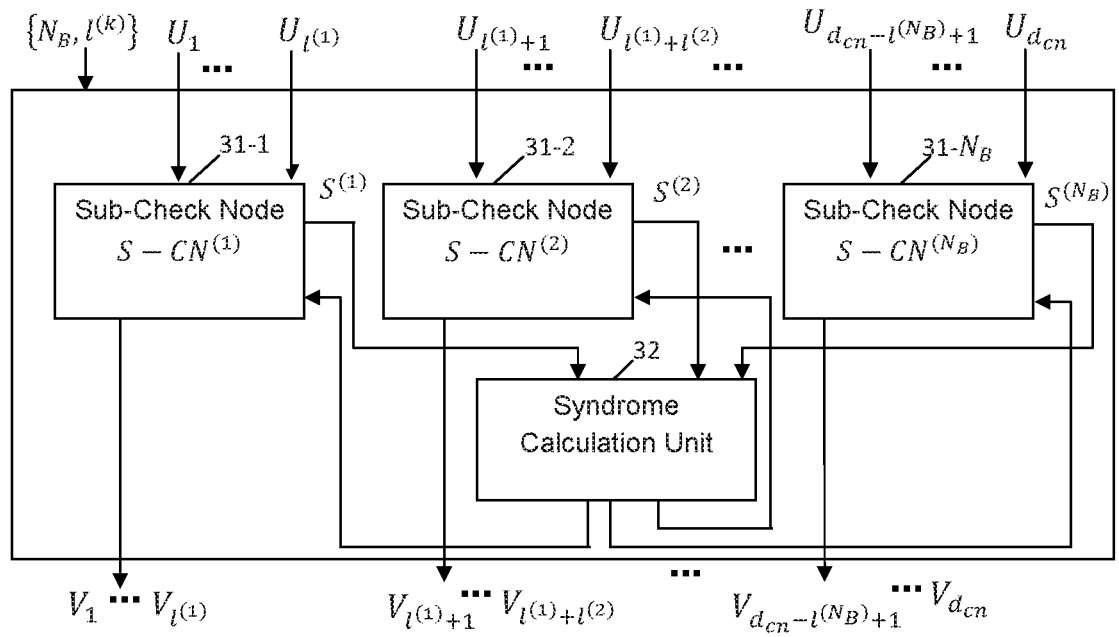
FIG. 3 is a block diagram illustrating the structure of a check node processing unit according to some embodiments.

FIG. 3 is a block diagram illustrating a block division of a check node processing unit 25-*cn* into $N_B \geq 2$ blocks of sub-check nodes S–CN$^{(k)}$ 31 (also designated by sub-check nodes 31-*k* with $k=1, \ldots, N_B$). Given the block division of the check node processing unit 25-*cn*, the computation of the check node messages may be performed through a computation of blocks of check node messages, each block of sub-check node 31 being configured to determine at least one check node message and one or more syndromes. As the check node messages are derived from all the received variable node messages $U_1, U_2, \ldots, U_d$, the determination of a block of $l^{(k)}$ check node messages $$V_{\Sigma_{a=1}^{k-1}l^{(a)}+1}, \ldots, V_{\Sigma_{a=1}^{k}l^{(a)}}$$

at a given sub-check node 31-*k* of index k may require, in addition to the received $l^{(k)}$ variable node messages $$U_{\Sigma_{a=1}^{k-1}l^{(a)}+1}, \ldots, U_{\Sigma_{a=1}^{k}l^{(a)}},$$

intermediate results computed by the remaining sub-check nodes 31-*b* with $b \neq k$ and $b=1, \ldots, N_B$.

In some embodiments, the intermediate results may consist of syndromes, a syndrome comprising a symbol and a reliability metrics associated with the symbol. In some embodiments, a syndrome may further comprise a binary vector. In such embodiments, the check node processing unit 25-*cn* may further comprise a syndrome calculation unit 32 configured to deliver, to at least one block of sub-check node, a set of one or more syndromes derived from the intermediate results determined by the remaining blocks of sub-check nodes. The derivation of the syndromes may depend on the type of the decoding architecture used to compute the check node messages.

Accordingly, the check node processing unit 25-*cn* may comprise at least two blocks of sub-check nodes 31, a block of sub-check node S–CN$^{(k)}$ 31-*k* of index $k=1, \ldots N_B$ being configured to:
determine a set $S^{(k)}$ comprising $NS^{(k)} \geq 1$ sub-check node syndromes from $l^{(k)} \geq 1$ (at least one) variable node messages $$U_{\Sigma_{a=1}^{k-1}l^{(a)}+1}, \ldots, U_{\Sigma_{a=1}^{k}l^{(a)}}$$

among the received variable node messages $U_1, U_2, \ldots, U_{d_{cn}}$,
send the sub-check node syndromes $S^{(k)}$ to the syndrome calculation unit 32, and
determine at least one check node message $$V_{\Sigma_{a=1}^{k-1}l^{(a)}+1}, \ldots, V_{\Sigma_{a=1}^{k}l^{(a)}}$$

from the intermediate results delivered by the syndrome calculation unit 32.

According to some embodiments, each block of sub-check node S–CN$^{(k)}$ 31-*k* of index $k=1, \ldots N_B$ may be configured to determine a sorted set of NS$^{(k)}$ sub-check node syndromes comprising syndromes sorted into a given order of the reliability metrics associated with the symbols.

Each block of sub-check nodes S–CN$^{(k)}$ 31-*k* may be further configured to deliver the check node messages $$V_{\Sigma_{a=1}^{k-1}l^{(a)}+1}, \ldots, V_{\Sigma_{a=1}^{k}l^{(a)}}$$

to the variable node processing units 27-*vn* corresponding to the variable nodes in the set $\mathcal{H}_c(cn)$ connected to the check node processing unit 25-*cn* which comprises the blocks of sub-check nodes S–CN$^{(k)}$ 31-*k* with $k=1, \ldots, N_B$.

In the following description, two examples of configurations with references to FIGS. 4 and 5 will be described to detail embodiments on the processing performed at the syndrome calculation unit 32 and the blocks of sub-check nodes.

For example, according to a first configuration, the syndrome calculation unit 32 may be configured to deliver, to each block of sub-check node S–CN$^{(k)}$ 31-*k* of index $k=1, \ldots N_B$, the set $\overline{S}^{(k)}$ comprising syndromes calculated from the sub-check node syndromes $S^{(b)}$ determined by one or more of the remaining blocks of sub-check nodes 31-*b* with $b \neq k$ and $b=1, \ldots, N_B$. This first configuration may be used in any check node architecture in which a computation of syndromes and check node messages are performed at check node processing units. Exemplary architectures comprise the forward-backward architecture, the syndrome-based architecture, and the syndrome-Bubble architecture. A modified version of the Forward-Backward enabling a computation of syndromes, as illustrated later through FIG. 13, may be also used in the first configuration.

In addition to the computation of a set of sub-check node syndromes, each block of sub-check node may be further configured, according to some embodiments implementing the first configuration, to determine intermediate sub-check node messages to be used for the computation of the check node messages.

According to this first configuration, a syndrome comprised in the set of syndromes $\overline{S}^{(k)}$ determined by the syndrome calculation unit 32 may comprise a symbol and a reliability metrics associated with the symbol, the syndrome calculation unit 32 being configured to:

determine a symbol comprised in a syndrome in the set $\overline{S}^{(k)}$ by applying an addition operation, over the algebraic structure of construction of the code, to the symbols comprised in the syndromes comprised in the received sets of sub-check node syndromes $S^{(b)}$ for $b \ne k$ and $b=1, \ldots, N_B$; and to determine a reliability metrics associated with a symbol comprised in a syndrome in the set $\overline{S}^{(k)}$ by applying an addition operation to the reliability metrics associated with the symbols comprised in the syndromes comprised in the received sets of sub-check node syndromes $S^{(b)}$ for $b \ne k$ and $b=1, \ldots, N_B$.

The syndrome calculation unit 32 may be configured to determine the set of syndromes $\overline{S}^{(k)}$ using elementary check node processors, implementing for example a forward-backward architecture.

In another example, according to a second configuration, the syndrome calculation unit 32 may be configured to determine a set $S=\{S_1, S_2, \ldots, S_{NS}\}$ of NS syndromes from the sub-check node syndromes comprised in the received sub-check node syndromes $S^{(k)}$, for $k=1, \ldots, N_B$. This second configuration may be used in any architecture involving a computation of syndromes at the block of sub-check node such as the syndrome-based architecture, the Bubble-syndrome, and the T-EMS algorithm, a variant of the EMS algorithm. Readers are referred to the following reference for example for more details about the T-EMS algorithm: 'Erbao Li; Francisco Garcia-Herrero; David Declercq; Kiran Gunnam; Jesús Omar Lacruz; Javier Valls, Low latency T-EMS decoder for non-binary LDPC codes, IEEE Asilomar Conference on Signals, Systems and Computers, pages 831-835, 2013'.

According to the second configuration, a syndrome comprised in the set of syndromes S determined by the syndrome calculation unit 32 may comprise a symbol, a reliability metrics associated with the symbol and a binary vector, the syndrome calculation unit 32 being configured to:

determine a symbol comprised in a syndrome in the set S by applying an addition operation, over the algebraic structure of construction of the code, to the symbols comprised in the syndromes comprised in the received sets of sub-check node syndromes $S^{(k)}$ for $k=1, \ldots, N_B$;

determine a reliability metrics associated with a symbol comprised in a syndrome in the set S by applying an addition operation to the reliability metrics associated with the symbols comprised in the syndromes comprised in the received sets of sub-check node syndromes $S^{(k)}$ for $k=1, \ldots, N_B$.

The syndrome calculation unit 32 may be configured to determine the set of syndromes S using elementary check node processors implementing for example a syndrome-Bubble architecture.

Figure 4:
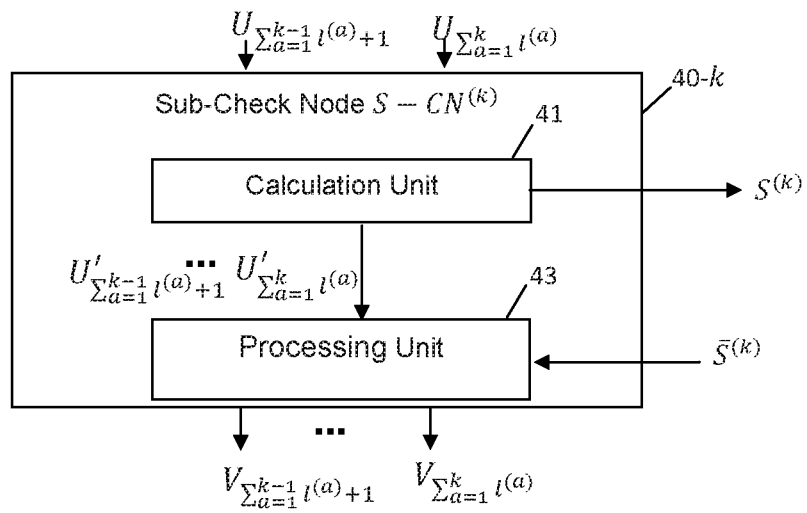
FIG. 4 is a block diagram illustrating the structure of a block of sub-check node, according to some embodiments.

FIG. 4 is a block diagram illustrating the structure of a sub-check node $S\text{–}CN^{(k)}$ 40-$k$ of index k varying between 1 and $N_B$, according to some embodiments using a first configuration according to which the syndrome calculation unit 32 (not shown in FIG. 4) is configured to provide each block of sub-check node $S\text{–}CN^{(k)}$ with a set of syndromes $\overline{S}^{(k)}$ comprising a syndromes calculated from the sub-check node syndromes determined by the remaining blocks of sub-check nodes $S\text{–}CN^{(b)}$ with $b \ne k$. The sub-check node $S\text{–}CN^{(k)}$ 40-$k$ may be configured to receive $l^{(k)} \ge 1$ variable node messages $$U_{\sum_{a=1}^{k-1} l^{(a)}+1}, \ldots, U_{\sum_{a=1}^{k} l^{(a)}}$$

and to determine at least one check node message $$V_{\sum_{a=1}^{k-1} l^{(a)}+1}, \ldots, V_{\sum_{a=1}^{k} l^{(a)}}.$$

Accordingly, the sub-check node S–CN(k) 40-$k$ may comprise:

a calculation unit 41 configured to determine a set of sub-check node syndromes $S^{(k)}$ comprising one or more syndromes and intermediate sub-check node messages denoted by $U'_{i(k)}$ for $i(k)=\sum_{a=1}^{k-1} l^{(a)}+1, \ldots, \sum_{a=1}^{k} l^{(a)}$, and a processing unit 43 configured to process the set $\overline{S}^{(k)}$ of syndromes received from the syndrome calculation unit 32.

More specifically, the calculation unit 41 may be configured to determine a set $S^{(k)}=\{S_1^{(k)}, S_2^{(k)}, \ldots, S_{NS^{(k)}}^{(k)}\}$ of $NS^{(k)} \ge 1$ sub-check node syndromes $S_r^{(k)}$, $r=1, \ldots, NS^{(k)}$ from the one or more variable node components $U_{i(k)}[j]=(U_{i(k)}^{\oplus}[j], U_{i(k)}^{+}[j])$ for $j=0, \ldots, n_{m,in}-1$ comprised in the variable node messages $U_{i(k)}$ with $i(k)=\sum_{a=1}^{k-1} l^{(a)}+1, \ldots, \sum_{a=1}^{k} l^{(a)}$. A syndrome denoted by $S_r^{(k)}=(S_r^{(k),\oplus}, S_r^{(k),+})$ for $r=1, \ldots, NS^{(k)}$ may comprise:

a symbol $S_r^{(k),\oplus}$ that may belong to the Galois Field GF(q), and a reliability metrics $S_r^{(k),+}$ associated with the symbol $S_r^{(k),\oplus}$.

More specifically, the calculation unit 41 may be configured to determine a symbol $S_r^{(k),\oplus}$ comprised in a syndrome $S_r^{(k)}$ of the set $S^{(k)}$ of sub-check node syndromes from the symbols $U_{i(k)}^{\oplus}[j]$, for $j=0, \ldots, n_{m,in}-1$, comprised in the one or more variable node components $U_{i(k)}[j]$, $j=0, \ldots, n_{m,in}-1$ comprised in the at least one variable node message $U_{i(k)}$ with $i(k)=\sum_{a=1}^{k-1} l^{(a)}+1, \ldots, \sum_{a=1}^{k} l^{(a)}$. A symbol $S_r^{(k),\oplus}$ comprised in a syndrome $S_r^{(k)}$ for $r=1, \ldots, NS^{(k)}$ can be expressed as a function of the symbols comprised in the variable node components according to:

$$S_r^{(k),\oplus} = U_{\sum_{a=1}^{k-1} l^{(a)}+1}^{\oplus}\left[u_{\sum_{a=1}^{k-1} l^{(a)}+1}\right] \oplus \cdots \oplus U_{\sum_{a=1}^{k-1} l^{(a)}+l^{(k)}}^{\oplus}\left[u_{\sum_{a=1}^{k} l^{(a)}}\right] \quad (4)$$

In equation (4), each index $u_{i(k)}$ for $i(k)=\sum_{a=1}^{k-1} l^{(a)}+1, \ldots, \sum_{a=1}^{k} l^{(a)}$ varies in the set $\{0, 1, \ldots, n_{m,in}-1\}$.

Further, the calculation unit 41 may be configured to determine the reliability metrics $S_r^{(k),+}$ associated with a symbol $S_r^{(k),\oplus}$ comprised in a syndrome $S_r^{(k)}$ of the set $S^{(k)}$ of sub-check node syndromes from the reliability metrics $U_{i(k)}^{+}[j]$, for $j=0, \ldots, n_{m,in}-1$ comprised in the one or more variable node components $U_{i(k)}[j]$, $j=0, \ldots, n_{m,in}-1$ comprised in the at least one variable node message $U_{i(k)}$ with $i(k)=\sum_{a=1}^{k-1} l^{(a)}+1, \ldots j, \sum_{a=1}^{k} l^{(a)}$. A reliability metrics $S_r^{(k),+}$ comprised in a syndrome $S_r^{(k)}$ for $r=1, \ldots, NS^{(k)}$ can be expressed as a function of the reliability metrics comprised in the variable node components according to:

$$S_r^{(k),+} = U^+_{\sum_{a=1}^{k-1} l^{(a)}+1}\left[u_{\sum_{a=1}^{k-1} l^{(a)}+1}\right] + \cdots + U^+_{\sum_{a=1}^{k} l^{(a)}}\left[u_{\sum_{a=1}^{k} l^{(a)}}\right] \quad (5)$$

The calculation unit 41 may be further configured to sort at least a part of the determined syndromes $S_r^{(k)}$ for $r=1, \ldots, NS^{(k)}$ into a given order of the reliability metrics $S_r^{(k),+}$.

Further, the calculation unit 41 may be configured to send the computed set $S^{(k)}$ of $NS^{(k)}$ syndromes to the syndrome calculation unit 32.

In addition to the generation of the sub-check node syndromes $S^{(k)}$, according to some embodiments, the calculation unit 41 may be configured to determine, from the variable node messages, intermediate sub-check node messages $$U'_{\sum_{a=1}^{k-1} l^{(a)}+1}, \ldots, U'_{\sum_{a=1}^{k} l^{(a)}},$$

an intermediate sub-check node message comprising intermediate components derived from the variable node components.

The block of sub-check node S–CN$^{(k)}$ 40-k may further comprise a processing unit 43 configured to:
receive, from the syndrome calculation unit 32, the sub-check node syndromes $\overline{S}^{(k)}$ comprising syndromes calculated from the sub-check node syndromes $S^{(b)}$ previously determined by one or more of the remaining blocks of sub-check nodes 31-b with b≠k and b=1, ..., $N_B$,
receive the intermediate sub-check node messages $$U'_{\sum_{a=1}^{k-1} l^{(a)}+1}, \ldots, U'_{\sum_{a=1}^{k} l^{(a)}}$$

from the calculation unit 41, and
determine the check node messages $$V_{\sum_{a=1}^{k-1} l^{(a)}+1}, \ldots, V_{\sum_{a=1}^{k} l^{(a)}}$$

from the set $\overline{S}^{(k)}$ and the intermediate check node messages, the check node messages comprising distinct symbols.

It should be noted that in particular embodiments in which a block of sub-check node S–CN$^{(k)}$ is configured to receive one variable node message, i.e. when $l^{(k)}=1$, no processing is performed at the block of sub-check node. In such embodiments, the syndromes comprised in the set of sub-check node syndromes $S^{(k)}$ delivered by the calculation unit 41 may comprise a part or a totality of the components comprised in the received variable node messages and the intermediate sub-check node messages may be identical to the variable node messages, i.e. $U_{i(k)}'=U_{i(k)}$, for $i(k)=\sum_{a=1}^{k-1} l^{(a)}+1$.

Figure 5:
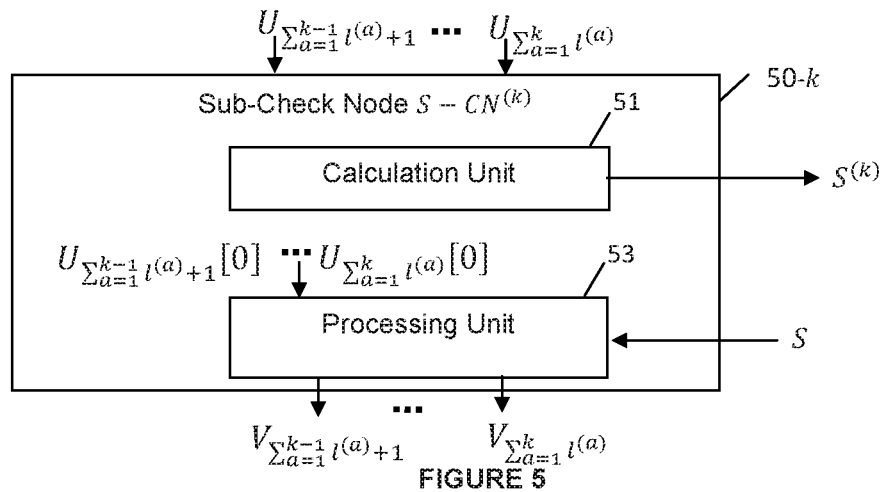
FIG. 5 is a block diagram illustrating the structure of a block of sub-check node, according to some embodiments.

FIG. 5 is a block diagram illustrating the structure of a sub-check node S–CN$^{(k)}$ 50-k of index k varying between 1 and $N_B$, according to some embodiments using a second configuration according to which the syndrome calculation unit 32 (not shown in FIG. 5) is configured to provide each block of sub-check node S–CN$^{(k)}$ with a set of syndromes S={$S_1, S_2, \ldots, S_{NS}$} comprising NS syndromes determined from the sub-check node syndromes comprised in the received sets $S^{(k)}$, k=1, ..., $N_B$. The sub-check node S–CN$^{(k)}$ 31-k may be configured to receive $l^{(k)} \geq 1$ variable node messages $$U_{\sum_{a=1}^{k-1} l^{(a)}+1}, \ldots, U_{\sum_{a=1}^{k} l^{(a)}}$$

and to determine one or more check node messages $$V_{\sum_{a=1}^{k-1} l^{(a)}+1}, \ldots, V_{\sum_{a=1}^{k} l^{(a)}}.$$

Accordingly, the sub-check node S–CN$^{(k)}$ 50-k may comprise a calculation unit 51 configured to determine sub-check node syndromes $S^{(k)}$ and a processing unit 53 configured to process the set S of syndromes received from the syndrome calculation unit 32.

In this second configuration, a syndrome denoted by $S_r^{(k)}=(S_r^{(k),\oplus}, S_r^{(k),+}, S_r^{(k),DBV})$, for $r=1, \ldots, NS^{(k)}$, may comprise:
a symbol $S_r^{(k),\oplus}$ that may belong to the Galois Field GF(q);
a reliability metrics $S_r^{(k),+}$ associated with the symbol $S_r^{(k),\oplus}$, and
a binary vector $S_r^{(k),DBV}$.

According to the second configuration, the calculation unit 51 may be configured to determine, similarly to the calculation unit 41 described in relation with FIG. 4, a set $S^{(k)}$ of $NS^{(k)}$ sub-check node syndromes $S_r^{(k)}=1, \ldots, NS^{(k)}$ from the one or more variable node components $U_{i(k)}[j]=(U_{i(k)}^\oplus[j], U_{i(k)}^+[j])$ for $j=0, \ldots, n_{m,in}-1$ comprised in the variable node messages $U_{i(k)}$ with $i(k)=\sum_{a=1}^{k-1} l^{(a)}+1, \ldots, \sum_{a=1}^{k} l^{(a)}$.

A symbol $S_r^{(k),\oplus}$ comprised in a syndrome $S_r^{(k)}$ for $r=1, \ldots, NS^{(k)}$ can be expressed according to equation 4.

A reliability metrics $S_r^{(k),+}$ comprised in a syndrome $S_r^{(k)}$ for $r=1, \ldots, NS^{(k)}$ can be expressed according to equation 5.

The calculation unit 51 may be further configured to determine the binary vectors $S_r^{(k),DBV}$ by determining initial binary values in association with the components of the variable node messages.

Accordingly, the calculation unit 51 may be configured to determine an initial binary value, denoted by $U_{i(k)}^{DBV}[j]$, in association with each component $U_{i(k)}[j]=(U_{i(k)}^\oplus[j], U_{i(k)}^+[j])$ for $j=0, \ldots, n_{m,in}-1$, of the variable node messages $U_{i(k)}$ for $i(k)=\sum_{a=1}^{k-1} l^{(a)}+1, \ldots, \sum_{a=1}^{k} l^{(a)}$.

According to some embodiments, the calculation unit 51 may be configured to determine the initial binary values depending on the reliability metrics $U_{i(k)}^+[j]$ associated with the symbols $U_{i(k)}^\oplus[j]$. In particular, the calculation unit 51 may be configured to determine:
an initial binary value equal to a predefined first value in association with the component $U_{i(k)}[0]$ comprising the most reliable symbol, and
an initial binary value equal to a predefined second value in association with the remaining components $U_{i(k)}[j]$ for $j=1, \ldots, n_{m,in}-1$.

According to some embodiments, the predefined first value may be equal to zero ('0') and the predefined second value may be equal to one ('1'). In such embodiments, the binary value associated with a component $U_{i(k)}[j]$ may be given by:

$$U_{i(k)}^{DBV}[j] = \begin{cases} 1 \text{ if } j \neq 0 \\ 0 \text{ if } j = 0 \end{cases} \quad (6)$$

Considering sorted variable node messages, conditional equation (6) states that the initial binary value associated with a component comprised in a variable node message is assigned a bit '0' value if the symbol comprised in said component is the most reliable symbol.

According to other embodiments, the predefined first value may be equal to one ('1') and the predefined second value may be equal to one ('0'). Accordingly, the initial binary value associated with a component comprised in a variable node message maybe equal to bit '1' if the symbol comprised in this component is the most reliable symbol, that is, $$U_{i(k)}^{DBV}[j] = \begin{cases} 0 \text{ if } j \neq 0 \\ 1 \text{ if } j = 0 \end{cases} \quad (7)$$

Accordingly, the binary vector $S_r^{(k),DBV}$ comprised in the syndrome $S_r^{(k)}$ may be written as a function of the initial binary values associated with the components of the variable node messages according to:

$$S_r^{(k),DBV} = \left( U_{\sum_{a=1}^{k-1} l^{(a)}+1}^{DBV} \left[ u_{\sum_{a=1}^{k-1} l^{(a)}+1} \right] \| \ldots \| U_{\sum_{a=1}^{k} l^{(a)}}^{DBV} \left[ u_{\sum_{a=1}^{k} l^{(a)}} \right] \right) \quad (8)$$

In equation (8), the operator ∥ designates the concatenation operation which provides, from two or more input scalars or vectors, a list in the form of a vector, the elements of the list being equal to the concatenated inputs.

According to equation (8), a binary vector $S_r^{(k),DBV}$ comprised in a syndrome $S_r^{(k)}$ comprises $l^{(k)}$ bits.

A syndrome comprised in the set of syndromes S denoted by $S_r=(S_r^{(k),\oplus}, S_r^{(k),+}, S_r^{(k),DBV})$, for r=1, . . . , NS, may comprise a GF(q) symbol denoted by $S_r^\oplus$, the reliability metrics associated with this symbol and denoted by $S_r^+$, and a binary vector denoted by $S_r^{DBV}$.

According to the calculation performed on the sub-check node syndromes of the sets $S^{(k)}$, k=1, . . . , $N_B$, a syndrome $S_r$ may be expressed as a function of the components of the variable node messages $U_1, U_2, \ldots, U_{d_{cn}}$ received by the check node processing unit 25-*cn* in which is comprised the sub-check node S–CN$^{(k)}$ 50-*k*. In particular:

a symbol $S_r^\oplus$ comprised in the syndrome $S_r$ for r=1, . . . , NS can be expressed as a function of the symbols comprised in the variable node messages $U_1, U_2, \ldots, U_{d_{cn}}$ according to:

$$S_r^\oplus = U_1^\oplus[u_1] \oplus U_2^\oplus[u_2] \oplus \ldots \oplus U_{d_{cn}-1}^\oplus[u_{d_{cn}-1}] \oplus U_{d_{cn}}^\oplus \quad (9)$$

In equation (9), each index $u_i$ for i=1, . . . , $d_{cn}$ varies in the set {0, 1, . . . , $n_{m,in}$−1}.

the reliability metrics $S_r^+$ associated with the symbol $S_r^\oplus$ can be expressed as a function of the reliability metrics comprised in the different components of the variable node messages $U_1, U_2, \ldots, U_{d_{cn}}$ according to:

$$S_r^+ = U_1^+[u_1] + U_2^+[u_2] + \ldots + U_{d_{cn}-1}^+[u_{d_{cn}-1}] + U_{d_{cn}}^+[u_{d_{cn}}] \quad (10)$$

the binary vector $S_r^{DBV}$ comprised in the syndrome $S_r$ may be written as a function of the initial binary values associated with each component of the variable node messages according to:

$$S_r^{DBV} = (U_1^{DBV}[u_1] \| \ldots \| U_{d_{cn}}^{DBV}[u_{d_{cn}}]) \quad (11)$$

According to equation (11), a binary vector $S_r^{DBV}$ comprised in a syndrome $S_r$ comprises $d_{cn}$ bits.

Moreover, the calculation unit 51 may be further configured to sort at least a part of the determined sub-check node syndromes $S_r^{(k)}$ for r=1, . . . , $NS^{(k)}$ into a given order of the reliability metrics $S_r^{(k),+}$.

Further, the calculation unit 51 may be configured to send the computed set $S^{(k)}$ of $NS^{(k)}$ sub-check node syndromes to the syndrome calculation unit 32.

According to FIG. 5, the block of sub-check node S–CN$^{(k)}$ 31-*k* may further comprise a processing unit 53 configured to:

receive, from the syndrome calculation unit 32, the set of syndromes S, and determine the check node messages $$V_{\sum_{a=1}^{k-1} l^{(a)}+1}, \ldots, V_{\sum_{a=1}^{k} l^{(a)}}$$

from the set S and the variable node messages, the check node messages comprising distinct symbols.

In particular embodiments in which a block of sub-check node S–CN$^{(k)}$ is configured to receive one variable node message, i.e. when $l^{(k)}$=1, the syndromes comprised in the set of sub-check node syndromes S(k) delivered by the calculation unit 51 may comprise a part or a totality of the components comprised in the received variable node messages, i.e $S^{(k)} = U_{i(k)}$, for $i(k) = \sum_{a=1}^{k-1} l^{(a)} + 1$.

Figure 6:
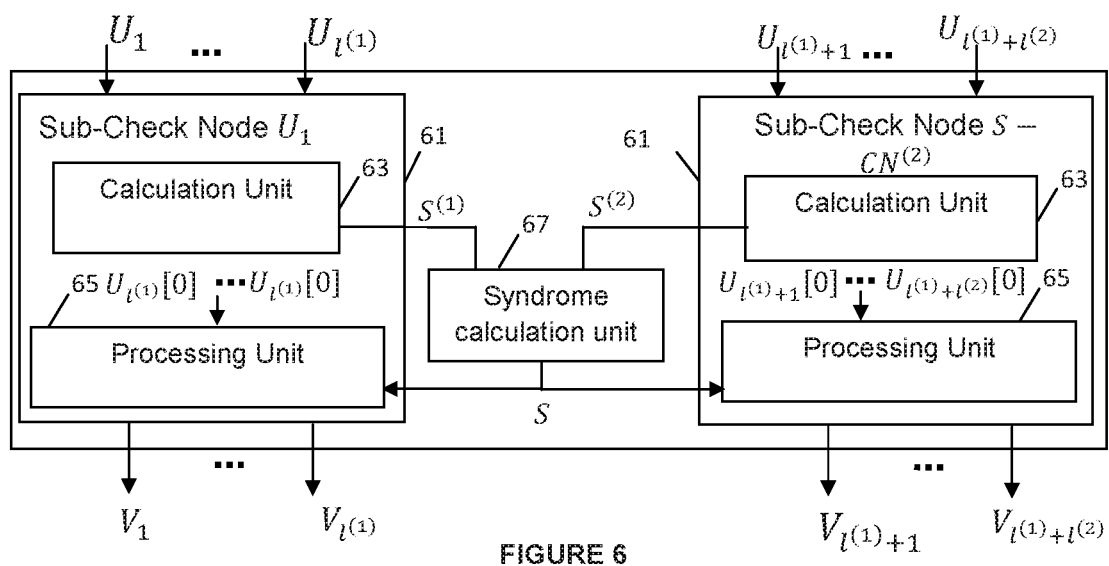
FIG. 6 is a block diagram illustrating the structure of a check node processing unit, according to some embodiments in which a block division of the check node processing unit into two blocks is used.
Figure 7:
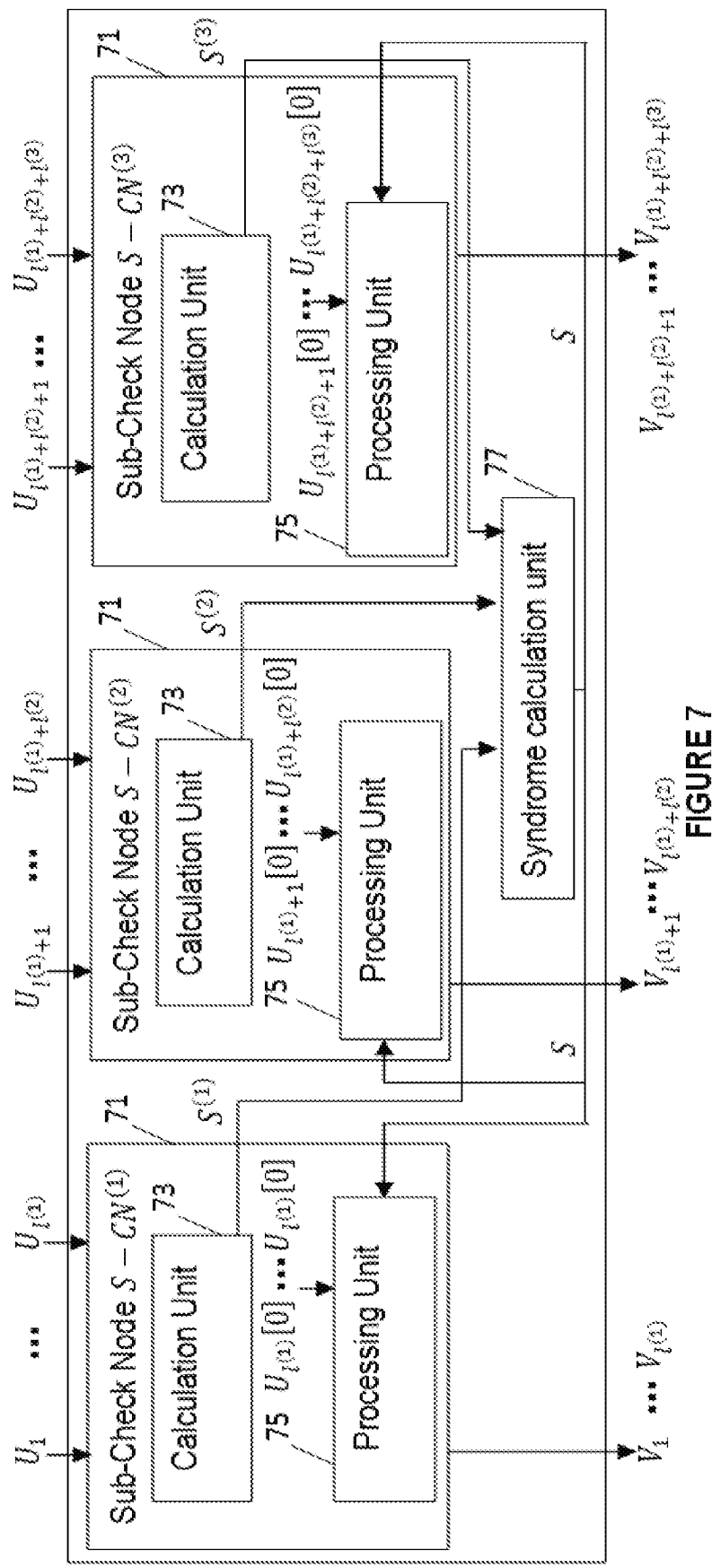
FIG. 7 is a block diagram illustrating the structure of a check node processing unit, according to some embodiments in which a block division of the check node processing unit into three blocks is used.

In order to better understand the block division of the check node processing unit 25-*cn*, two examples of a division into $N_B$=2 and $N_B$=3 blocks are illustrated respectively through FIG. 6 and FIG. 7. These two examples correspond to a second configuration involving a computation of a set of syndromes S at the syndrome calculation unit 32.

FIG. 6 is a block diagram illustrating the structure of a check node processing unit 25-*cn* of a set of block division parameters given by {$N_B$=2; $l^{(1)}$≥1; $l^{(2)}$≥1}. The check node processing unit 25-*cn* may accordingly comprise two blocks of sub-check nodes S–CN$^{(1)}$ 61 and S–CN$^{(2)}$ 61 and a syndrome calculation unit 67 such that:

the syndrome calculation unit 67 is configured to determine a set of syndromes S from the received sub-check node syndromes $S^{(1)}$ and $S^{(2)}$ previously determined by the block of sub-check node S–CN$^{(1)}$ 61 and the block of sub-check node S–CN$^{(2)}$ 61, respectively, the block of sub-check node S–CN$^{(1)}$ 61 is configured to receive $l^{(1)}$ variable node messages $U_1, \ldots, U_{l^{(1)}}$ and to determine $l^{(1)}$ check node messages $V_1, \ldots, V_{l^{(1)}}$ from the set of syndromes S;

the block of sub-check node S–CN$^{(2)}$ 61 is configured to receive $l^{(2)}$ variable node messages $U_{l^{(1)}+1}, \ldots, U_{l^{(1)}+l^{(2)}}$ and to determine $l^{(2)}$ check node messages $V_{l^{(1)}+1}, \ldots, V_{l^{(1)}+l^{(2)}}$ from the set of syndromes S.

FIG. 7 is a block diagram illustrating the structure of a check node processing unit 25-*cn* of a set of block division parameters given by {$N_B$=3; $l^{(1)}$≥1; $l^{(2)}$≥2; $l^{(3)}$≥1}. The check node processing unit 25-*cn* may accordingly comprise three blocks of sub-check nodes S–CN$^{(1)}$ 71, S–CN$^{(2)}$ 71, and S–CN$^{(3)}$ 71 and a syndrome calculation unit 77 such that:

the syndrome calculation unit 77 is configured to determine a set of syndromes S from the received sub-check node syndromes $S^{(1)}$, $S^{(2)}$, and $S^{(3)}$ previously determined by the block of sub-check node S–CN$^{(1)}$ 71, the block of sub-check node S–CN$^{(2)}$ 71, and the block of sub-check node S–CN$^{(3)}$ 71, respectively, the block of sub-check node S–CN$^{(1)}$ 71 is configured to receive $l^{(1)}$ variable node messages $U_1, \ldots, U_{l^{(1)}}$ and to determine $l^{(1)}$ check node messages $V_1, \ldots, V_{l^{(1)}}$ from the set of syndromes S;

the block of sub-check node S–CN$^{(2)}$ 71 is configured to receive $l^{(2)}$ variable node messages $U_{l^{(1)}+1}, \ldots, U_{l^{(1)}+l^{(2)}}$ and to determine $l^{(2)}$ check node messages $V_{l^{(1)}+1}, \ldots, V_{l^{(1)}+l^{(2)}}$ from the set of syndromes S;

the block of sub-check node S–CN$^{(3)}$ 71 is configured to receive $l^{(3)}$ variable node messages $U_{l^{(1)}+l^{(2)}+1}, \ldots, U_{l^{(1)}+l^{(2)}+l^{(3)}}$ and to determine $l^{(3)}$ check node messages $V_{l^{(1)}+l^{(2)}+1}, \ldots, V_{l^{(1)}+l^{(2)}+l^{(3)}}$ from the set of syndromes S.

In general, the computation of the blocks of check node messages performed by each of the blocks of sub-check nodes S–CN$^{(k)}$ 31-$k$, thus the processing performed at the level of the calculation units and the processing units, may depend on the architecture according to which the decoding process is performed. For example, in some embodiments using the EMS algorithm, the computation of the check node messages by each block of sub-check node S–CN$^{(k)}$ 31-$k$ may depend on whether a Forward-Backward architecture or a Syndrome-based architecture is implemented.

Inspired by the Forward-Backward architecture and the Syndrome-based architecture, there are provided three examples of architectures of a sub-check node that may be implemented, without loss of generality, and are given by:

a 'syndrome sub-check node' architecture implementing a syndrome decoding architecture by blocks;

a 'Bubble-syndrome sub-check node' architecture implementing a plurality of elementary check node processors for the computation of the set of sub-check node syndromes at the sub-check node, and a 'Forward-Backward sub-check node' architecture implementing a Forward-Backward architecture by blocks.

According to some embodiments, a same architecture of sub-check node may be implemented in all of the blocks of a check node processing unit 25-$cn$ divided into $N_B$ blocks of sub-check nodes S–CN$^{(k)}$ 31-$k$ for $k=1, \ldots, N_B$.

In other embodiments, a check node processing unit 25-$cn$ divided into $N_B$ blocks of sub-check nodes S–CN$^{(k)}$ 31-$k$ for $k=1, \ldots, N_B$ may comprise at least two sub-check nodes S–CN$^{(k1)}$ and S–CN$^{(k2)}$ implementing a different sub-check node architecture.

Using a syndrome sub-check node architecture in the various blocks of sub-check nodes S–CN$^{(k)}$ 31-$k$ for $k=1, \ldots, N_B$, the complexity of syndrome decoding, dominated by $O(d_{cn}^2)$ when syndrome decoding is used, can be reduced to $$O\left(\left(\frac{d_{cn}}{N_B}\right)^2\right).$$

Using a Bubble-syndrome sub-check node architecture in the various blocks of sub-check nodes S–CN$^{(k)}$ 31-$k$ for $k=1, \ldots, N_B$, the complexity is reduced and is linear with the degree $d_{cn}$ of the check node processing unit 25-$cn$.

Using a Forward-Backward sub-check node architecture in the various blocks of sub-check nodes S–CN$^{(k)}$ 31-$k$ for $k=1, \ldots, N_B$, the decoding latency is reduced and divided by the number of blocks $N_B$ comprised in the check node processing unit 25-$cn$.

The following description of some embodiments will be made with reference to the three above mentioned sub-check node architectures in application to the EMS decoding algorithm, for illustration purpose only. However, it should be noted that block decoding involving at least two blocks of sub-check nodes may be applied to other iterative decoding algorithms such as the T-EMS algorithm and the min-max algorithm.

Figure 8:
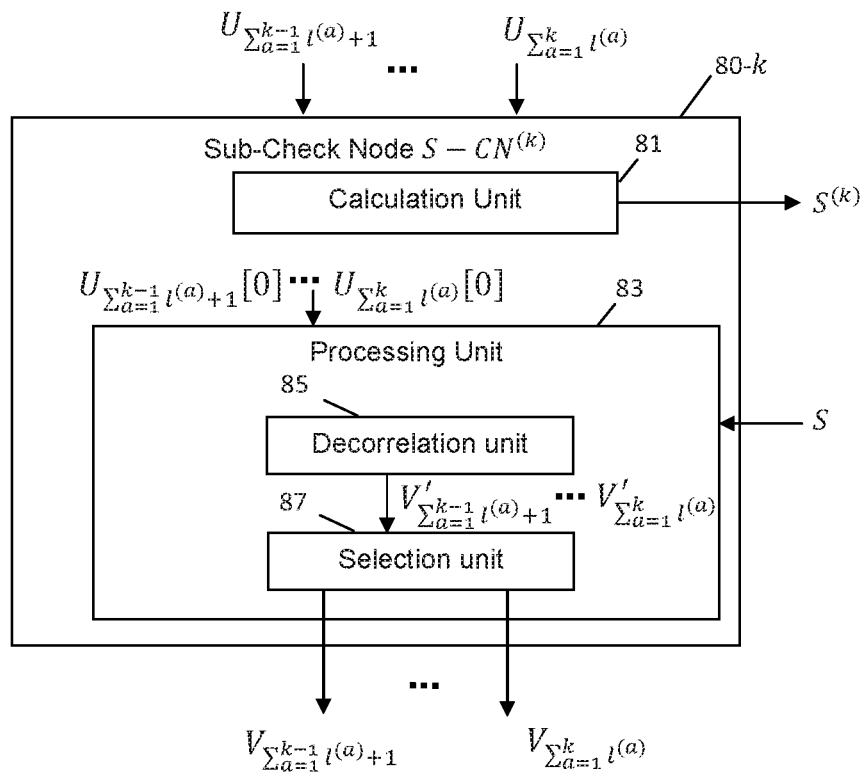
FIG. 8 is a block diagram illustrating the structure of a block of sub-check node, according to some embodiments.

FIG. 8 is a block diagram illustrating the structure of a sub-check node S–CN$^{(k)}$ 80-$k$, according to some embodiments in which a syndrome sub-check node architecture implementing the second configuration is used. Accordingly, the sub-check node S–CN$^{(k)}$ 80-$k$ may comprise a calculation unit 81 configured to determine a set $S^{(k)} = \{S_1^{(k)}, S_2^{(k)}, \ldots, S_{NS^{(k)}}^{(k)}\}$ of $NS^{(k)} \geq 1$ sub-check node syndromes $S_r^{(k)}$, $r=1, \ldots, NS^{(k)}$ from the one or more variable node components $U_{i(k)}[j] = (U_{i(k)}^{\oplus}[j], U_{i(k)}^{+}[j])$ for $j=0, \ldots, n_{m,in}-1$ comprised in the variable node messages $U_{i(k)}$ with $i(k) = \Sigma_{a=1}^{k-1}l^{(a)}+1, \ldots, \Sigma_{a=1}^{k}l^{(a)}$. In addition to a symbol and its reliability metric, each syndrome $S_r^{(k)}$ may comprise in such embodiments a binary vector. The expressions of the symbols, reliability metrics associated with the symbols and the binary vectors are given respectively according to equations (4), (5), and (8). The set of sub-check node syndromes may be advantageously sorted or partially sorted into a given order of the reliability metrics comprised therein.

The sub-check node S–CN$^{(k)}$ 80-$k$ may further comprise a processing unit 83 configured to receive the set S previously determined by the syndrome calculation unit 32 (not shown in FIG. 8) from one or more of the sub-check node syndromes generated by the remaining blocks of sub-check nodes, and—to determine the check node messages $$V_{\Sigma_{a=1}^{k-1}l^{(a)}+1}, \ldots, V_{\Sigma_{a=1}^{k-1}l^{(a)}+l^{(k)}},$$

a check node message $V_{i(k)}$ for $i(k) = \Sigma_{a=1}^{k-1}l^{(a)}+1, \ldots, \Sigma_{a=1}^{k-1}l^{(a)}+l^{(k)}$ comprising distinct symbols and being destined to a variable node processing unit 27-$i(k)$ in the set of variable node processing units $\mathcal{H}_c(cn)$.

Given the received set of syndromes $S = \{S_1, S_2, \ldots, S_{NS}\}$, the check node components $V_{i(k)}[j]$ comprised in the check node messages $V_{i(k)}$ for $i(k) = \Sigma_{a=1}^{k-1}l^{(a)}+1, \ldots, \Sigma_{a=1}^{k}l^{(a)}$, may be determined by:

1) determining, from the set $S = \{S_1, S_2, \ldots, S_{NS}\}$ of syndromes, a set of candidate check node components depending on the binary vectors comprised in the set of syndromes, the candidate check node components comprising one or more components comprising a symbol and a reliability metric. In some embodiments, the candidate check node components may comprise two or more components comprising a same symbol, and 2) selecting a number of check node components $n_{m,out}$ from the determined set of candidate check node components depending on the reliability metrics associated with the symbols, the check node components comprising distinct symbols.

Accordingly, the processing unit 83 of the sub-check node S–CN$^{(k)}$ 80-$k$ may comprise a decorrelation unit 85 configured to determine, in association with each check node message $V_{i(k)}$ for $i(k) = \Sigma_{a=1}^{k-1}l^{(a)}+1, \ldots, \Sigma_{a=1}^{k}l^{(a)}$, the set of candidate check node components denoted by $V_{i(k)}'$ from the determined set of NS syndromes S. Each candidate check node component $V_{i(k)}'[z]=(V_{i(k)}^{\oplus\prime}[z],V_{i(k)}^{+\prime}[z])$ comprising a symbol $V_{i(k)}^{\oplus\prime}[z]$ and the reliability metrics $V_{i(k)}^{+\prime}[z]$ associated with the symbol.

More specifically and according to some embodiments (not depicted in the figures), the decorrelation unit 85 may comprise $d_{f^{(k)}}$ elementary decorrelation units, each elementary decorrelation unit being associated with a check node message $V_{i(k)}$ and being configured to determine the set of candidate check node components $V_{i(k)}'$ depending on the binary vectors comprised in each syndrome of the set of syndromes S.

The binary vectors called Discard Binary Vectors (DBVs) may be accordingly used to indicate for which output edge a syndrome should be discarded and therefore not selected by the decorrelation unit 85. More precisely, an elementary decorrelation unit may be configured to determine a set of candidate check node components $V_{i(k)}'$ in association with each check node message $V_{i(k)}$ by selecting, among the received set of syndromes S, the syndromes comprising binary vectors $S_r^{DBV}=(S_r^{DBV}[1]\|S_r^{DBV}[2],\ldots\|S_r^{DBV}[d_{cn}])$ such that the bit $S_r^{DBV}[i(k)]$ associated with the check node message $V_{i(k)}$ is equal to a given value. A reading of the bit in the binary vector comprised in a syndrome may be used to validate or not the selection of the syndrome so as to determine the set of candidate check node components in association with a given check node message. Each elementary decorrelation unit may be accordingly configured to determine the set of candidate check node components $V_{i(k)}'$ from the symbols and their reliability metrics comprised in the selected valid syndromes, the candidate check node components corresponding to the components comprised in the validated syndromes and the number of components in the set of candidate check node components being equal to the number of selected valid syndromes.

According to an embodiment, an elementary decorrelation unit may be configured to determine a set of candidate check node components $V_{i(k)}'$ in association with each check node message $V_{i(k)}$ by selecting, among the received set of syndromes S, the syndromes comprising binary vectors $S_r^{DBV}(S_r^{DBV}[1]\|S_r^{DBV}[2],\ldots\|S_r^{DVB}[d_{cn}])$ such that the bit $S_r^{DBV}[i(k)]$ associated with the check node message $V_{i(k)}$ is equal to zero ('0').

According to another embodiment, an elementary decorrelation unit may be configured to determine a set of candidate check node components $V_{i(k)}'$ in association with each check node message $V_{i(k)}$ by selecting, among the received set of syndromes S, the syndromes comprising binary vectors $S_r^{DBV}(S_r^{DVB}[1]\|S_r^{DBV}[2],\ldots|S_r^{DVB}[d_{cn}])$ such that the bit $S_r^{DBV}[i(k)]$ associated with the check node message $V_{i(k)}$ is equal to one ('1').

The valid syndromes selected to determine the set of candidate check node components $V_{i(k)}'$ comprise $NVS_{i(k)} \leq NS$ valid syndromes, denoted by $VS[z]$ for $z=0,\ldots,NVS_{i(k)}-1$. A valid syndrome $VS[z]=(VS^{\oplus}[z],VS^+[z],VS^{DBV}[z])$ comprises a symbol $VS^{\oplus}[z]$, the reliability metrics $VS^+[z]$ associated with the symbol, and a binary vector denoted by $VS^{DBV}[z]$. The valid syndromes are sorted according to an order (increasing or decreasing) of the reliability metrics $VS^+[z]$ such that the valid symbol comprising the most reliable symbol corresponds to $VS[0]$ and that $VS^+[z] \leq VS^+[z+1]$ for $z=0,\ldots,NVS_{i(k)}-2$.

Given the valid syndromes, the candidate check node components $V_{i(k)}'[z]=(V_{i(k)}^{\oplus\prime}[z],V_{i(k)}^{+\prime}[z])$ for $z=0,\ldots,NVS_{i(k)}-1$ may be determined from the values of the symbols $VS^{\oplus}[z]$ and the reliability metrics $VS^+[z]$ comprised in the selected valid syndromes. More specifically, the symbol $V_{i(k)}^{\oplus\prime}[z]$ comprised in the candidate check node component $V_{i(k)}'[z]$ may be determined according to:

$$V_{i(k)}^{\oplus\prime}[z]=VS^{\oplus}[z]\oplus U_{i(k)}^{\oplus}[0] \quad (12)$$

The reliability metrics $V_{i(k)}^{+\prime}[z]$ comprised in the candidate check node component $V_{i(k)}'[z]$ may be determined by:

$$V_{i(k)}^{+\prime}[z]=VS^+[z] \quad (13)$$

The processing unit 83 may further comprise a selection unit 87 configured to select $n_{m,out}$ check node components from the determined set of candidate check node components $V_{i(k)}'$ depending on the reliability metrics $V_{i(k)}^{+\prime}[z]$ associated with the symbols $V_{i(k)}^{\oplus\prime}[z]$, the set of candidate check node components $V_{i(k)}'$ comprising $NVS_{i(k)}$ components.

According to some embodiments, the selection unit 87 may be configured to select $n_{m,out}$ check node components comprising distinct symbols from the set of candidate check node components. Accordingly, the selection unit 87 may be first configured to perform a redundancy elimination in the set of candidate check node components $V_{i(k)}'$ for keeping, among the components comprising the same symbol (i.e. among the components comprising redundant symbols), the one which comprises the most reliable symbol. At a second step, the selection unit 87 may be configured to select $n_{m,out} \leq NVS_{i(k)}$ components from the processed candidate check node components, depending on the reliability metrics of the symbols comprised in the processed candidate check node components, such that the $n_{m,out}$ components comprising the most reliable distinct symbols are selected.

According to other embodiments, the selection unit 87 may be configured to select the $n_{m,out}$ check node components from the determined candidate check node components $V_{i(k)}'$ by performing only the redundancy elimination in the set of candidate check node components $V_{i(k)}'$. In other words, the selected $n_{m,out}$ check node components may correspond to the candidate check node components $V_{i(k)}'[z]$ that comprise distinct symbols. In embodiments in which the set of candidate check node components $V_{i(k)}'$ does not comprise components having a same symbol, the selected $n_{m,out}$ check node components may correspond to the components comprised in the selected valid syndromes, $n_{m,out}$ being in this case equal to the number of valid syndromes, i.e. $n_{m,out}=NVS_{i(k)}$.

According to other embodiments, the selection unit 87 may be configured to select the $n_{m,out}$ check node components from the determined candidate check node components $V_{i(k)}'$ without performing a redundancy elimination among the candidate check node components comprising redundant symbols. In such embodiments, the selection unit 87 may be configured to select, among the $NVS_{i(k)}$ check node components, the most reliable $n_{m,out} \leq NVS_{i(k)}$ components.

Still in other embodiments, the selection unit 87 may be configured to select $n_{m,out}=NVS_{i(k)}$ check node components from the determined candidate check node components $V_{i(k)}'$ without performing a redundancy elimination, the number $n_{m,out}$ of check node components being equal to the number $NVS_{i(k)}$ of the selected valid syndromes and the selected check node components corresponding to the components comprised in the selected valid syndromes.

It should be noted that in embodiments in which the selection unit 87 does not perform a redundancy elimination, the check node components may comprise two or more components comprising a same symbol. In such embodiments, the redundancy elimination may be performed at the level of the variable node processing units receivers of the check node messages.

According to some embodiments, the selection units 87 implemented in the various blocks of sub-check nodes S–CN$^{(k)}$ 80-$k$, for $k$ varying in $1, \ldots, N_B$, may be configured to select a same number $n_{m,out}$ of check node components to determine the check node messages.

According to other embodiments, the selection units 87 implemented in one or more of the blocks of sub-check nodes S–CN$^{(k)}$ 80-$k$ may be configured to select a different number $n_{m,out}$ of check node components to determine the check node messages. In such embodiments, the variables node processing units 27-$vn$ configured to receive these check node messages may be configured to perform a truncation operation to retain a same number of components in each received check node message.

Further, according to some embodiments, the number $n_{m,out}$ of check node components may be different from the number $n_{m,in}$ of components in the variable node messages. In particular, the number of check node components may satisfy $n_{m,out} \geq n_{m,in}$.

In some embodiments, the number $n_{m,out}$ of check node components may depend on the number of components $n_{m,in}$ comprised in the variable node messages.

The number $n_{m,out}$ of check node components may further depend on the error correcting code (e.g. the algebraic structure over which the code is constructed) and/or on the order of the decoding iteration of the iterative decoding process and/or on the signal-to-noise ratio and/or on the computational and storage capabilities of the check node processing units 25-$cn$.

In some other embodiments, the number $n_{m,out}$ of check node components may depend on a combination of the factors previously cited.

According to some embodiments, the syndromes computation at the calculation unit 81 may be performed using at least one elementary check node processor, the set of sub-check node syndromes S$^{(k)}$ being determined from elementary results generated by the various elementary check node processors. This type of architecture is referred to as Bubble-syndrome sub-check node architecture.

According to the Bubble-syndrome sub-check node architecture, the computation of the set S$^{(k)}$ of sub-check node syndromes at a sub-check node S–CN$^{(k)}$ 80-$k$ may involve $l^{(k)}$–1 elementary check node processors.

The use of elementary check node processors for the computation of the set of syndromes enables reducing the computational complexity involved in the syndromes computation. Indeed, with the use of elementary check node processors, the number of computed syndromes used for determining check node messages is reduced, thereby making it possible to exploit the parallelism of syndrome decoding while alleviating the computational complexity which is generally due to the high number of computed syndromes. In addition, the elementary check node processors provide sorted components (depending on the order of the reliability metrics of the symbols) in the computed elementary messages. As a result, the sorting operation performed at the calculation unit applied after syndrome calculation can be removed, thereby enabling a reduction of the computational complexity required for the sorting process as well as a reduction of the implementation costs.

Figure 9:
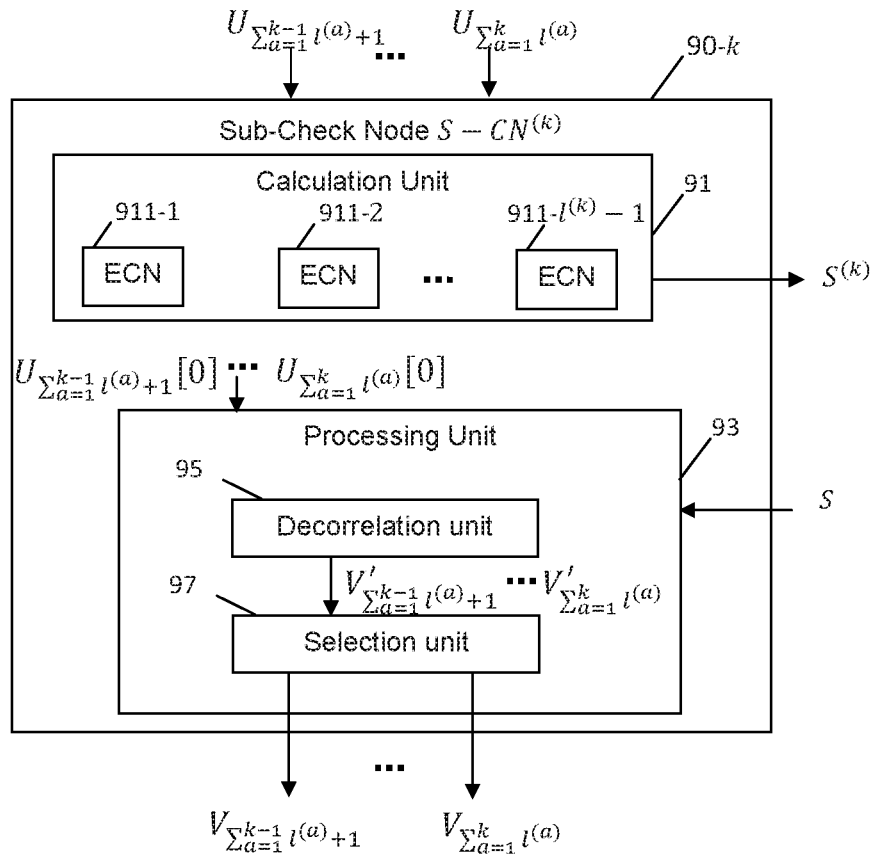
FIG. 9 is a block diagram illustrating the structure of a block of sub-check node, according to some embodiments in which the computation of syndromes is performed by a plurality of elementary check node processors.

FIG. 9 is a block diagram illustrating the structure of a sub-check node S–CN$^{(k)}$ 90-$k$, according to some embodiments in which a Bubble-syndrome sub-check node architecture implementing the second configuration is used.

Accordingly, the calculation unit 91 may comprise $l^{(k)}$–1 elementary check node processors 911-$a$ with $a=1, \ldots, l^{(k)}$–1, each elementary check node processor 911-$a$ being configured to determine an intermediate message (also referred to as 'elementary message') from a first message and a second message, the first message and the second message being derived from the variable node messages $$U_{\sum_{a=1}^{k-1} l^{(a)}+1}, \ldots, U_{\sum_{a=1}^{k} l^{(a)}}.$$

An intermediate message denoted by $W_t'$ may comprise a number $n_t \geq 1$ of sorted intermediate components and an intermediate binary vector associated with each intermediate component, the intermediate components being sorted according to a given order of the reliability metrics of the symbols comprised therein.

In some embodiments, each elementary check node processor 911-$a$ may be configured to determine the symbol comprised in an intermediate component of an intermediate message by applying an addition operation over the Galois Field (in general over the structure over which the error correcting code is constructed), said addition operation being applied to the symbol comprised in a component of the first message and to the symbol comprised in a component of the second message.

Moreover, each elementary check node processor 911-$a$ may be configured to determine the reliability metrics associated with the symbol comprised in an intermediate component of an intermediate message by applying an addition operation over a given algebraic structure to the reliability metrics comprised in a component of the first message and the reliability metrics comprised in a component of the second message.

According to some embodiments, the algebraic structure may be chosen in a group consisting of the field $\mathbb{R}$ of real numbers, the field $\mathbb{Z}$ of integer numbers, and the field $\mathbb{N}$ of natural numbers.

For example in quantized hardware implementations and/or software implementations, each elementary check node processor 911-$a$ may be configured to determine the reliability metrics associated with the symbol comprised in an intermediate component of an intermediate message by applying an addition operation over the integer field $\mathbb{Z}$ or the field of natural numbers $\mathbb{N}$, enabling a complexity reduction.

Further, each component of the first message and the second message processed by a given elementary check node processor 911-$a$ may be associated with a binary vector derived from the initial binary values. In such embodiments, each elementary check node processor 911-$a$ may be configured to determine the intermediate binary vector associated with an intermediate component by applying a vector concatenation operation, the vector concatenation operation being applied to the binary vector associated with a component of the first message and to the binary vector associated with a component of the second message.

According to some embodiments, the elementary check node processor 911-$a$ may be configured to determine the intermediate message by processing a number of components lower than or equal to $n_{m,in}$ from the first message and/or a number of components lower than or equal to $n_{m,in}$ from the second message.

Among the $l^{(k)}$–1 elementary check node processors 911-$a$, at least one elementary check node processor 911-$a$ may be configured to determine an intermediate message and an intermediate binary vector associated with each component of the intermediate message from two variable node messages, the first and second messages being equal to a first variable node message and a second variable node message, respectively.

According to some embodiments in which the first message and second message are different from the variable node messages, i.e. correspond to intermediate messages delivered by previous elementary check node processors 911-a in the architecture, the number of components processed from the first message and/or the number of components processed from the second message may correspond to the number of components previously delivered by an elementary check node processor 911-a. In other words, the number of components processed by a given elementary check node processor 911-a may depend on the number of components comprised in the previous intermediate messages processed by the elementary check node processors 911-a located at previous stages in the architecture.

The elementary check node processors 911-a may be implemented in the calculation unit 91 according to various architectures including, for examples, a serial architecture, a tree architecture, and a hybrid architecture.

According to some embodiments in which a check node processing unit 25-cn is divided into two or more blocks of sub-check nodes of a Bubble-syndrome sub-check node type, the elementary check node processors comprised in each calculation unit of each block of sub-check node may be implemented according to a same architecture.

In some other embodiments in which a check node processing unit 25-cn is divided into two or more blocks of sub-check nodes of a Bubble-syndrome sub-check node type, one or more of the calculation units comprised in each block of sub-check nodes may implement the elementary check node processors according to a different architecture.

Figure 10:
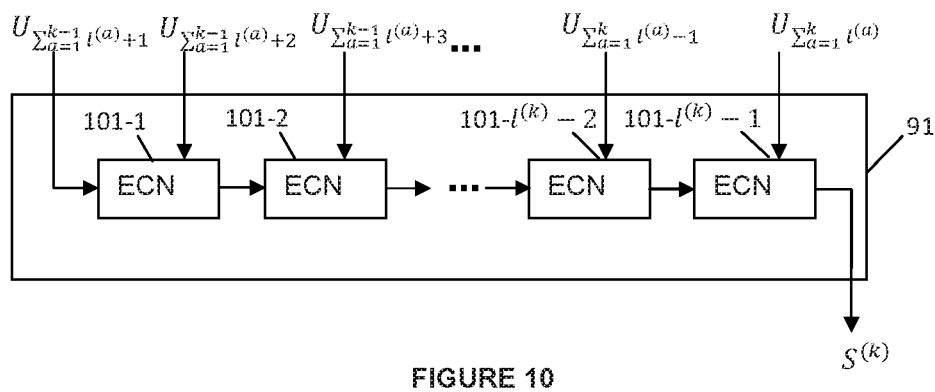
FIG. 10 is a block diagram illustrating the structure of a calculation unit, according to some embodiments in which a serial implementation of elementary check node processors is considered.

FIG. 10 is a block diagram illustrating the structure of a calculation unit 91 comprised in a sub-check node S–CN$^{(k)}$ 90-k implementing a Bubble-syndrome sub-check node architecture, according to some embodiments in which the $1^{(k)}-1$ elementary check node processors are implemented in a serial architecture. Accordingly, the calculation unit 91 may comprise an elementary check node processor 101-1 configured to determine an intermediate message and the associated intermediate binary vector with each component of the intermediate message by processing two variable node messages $U_{\Sigma_{a=1}^{k-1}1^{(a)}+1}$ and $U_{\Sigma_{a=1}^{k-1}1^{(a)}+2}$. The remaining elementary check node processors 101-b for b=2, . . . , $1^{(k)}-1$ may be each configured to process one variable node message and one intermediate message previously determined by an elementary check node processor 101-c for c=1, . . . , b-1 operating at a previous stage in the serial architecture.

Figure 11:
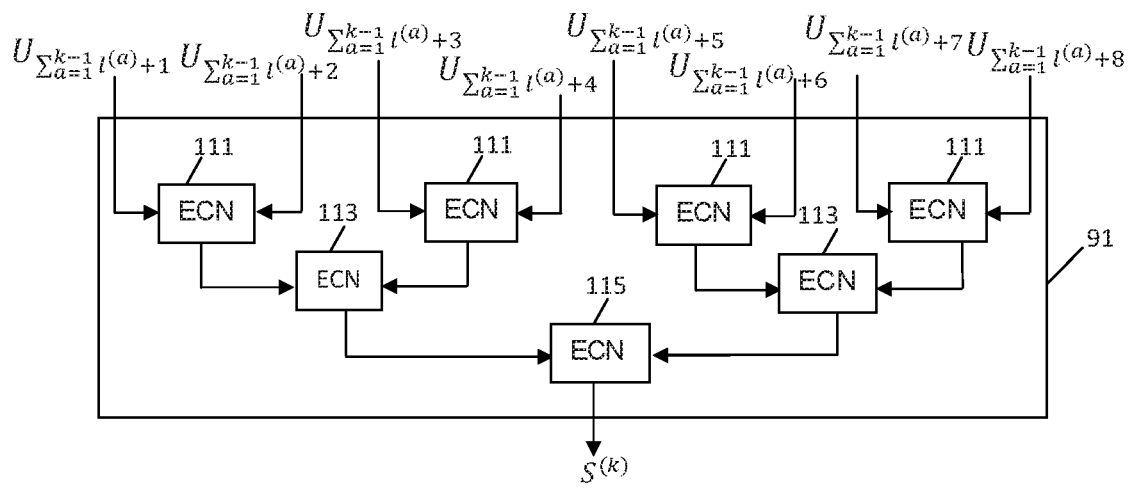
FIG. 11 is a block diagram illustrating an exemplary structure of a calculation unit, according to some embodiments in which a tree implementation of elementary check node processors is considered.

FIG. 11 is a block diagram illustrating the structure of a calculation unit 91 comprised in a sub-check node S–CN$^{(k)}$ 90-k with $1^{(k)}=8$ implementing a Bubble-syndrome sub-check node architecture, according to some embodiments in which the $1^{(k)}-1$ elementary check node processors are implemented in a tree architecture. Accordingly, the calculation unit 91 may comprise at least one elementary check node processor 111 configured to determine an intermediate message and the intermediate binary vector associated with each component of the intermediate message by processing two variable node messages. The remaining elementary check node processors 113 and/or elementary check node processors 115 may be configured to determine an intermediate message and the intermediate binary vector associated with each component of the intermediate message either by processing at least one variable node message previously determined by at least one elementary check node processor 111 and/or one elementary check node processor 115 operating at previous stages of the tree architecture.

Figure 12:
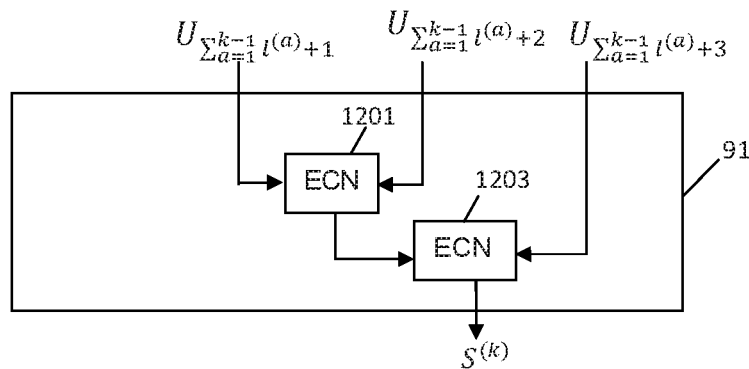
FIG. 12 is a block diagram illustrating an exemplary structure of a calculation unit, according to some embodiments in which a hybrid implementation of elementary check node processors is considered.

FIG. 12 is a block diagram illustrating the structure of a calculation unit 91 comprised in a sub-check node S–CN$^{(k)}$ 90-k with $1^{(k)}=3$ implementing a Bubble-syndrome sub-check node architecture, according to some embodiments in which the elementary check node processors are implemented in a hybrid architecture. Accordingly, the calculation unit 91 may comprise at least one elementary check node processor 1201 configured to determine an intermediate message and the intermediate binary vector associated with each component of the intermediate message by processing two variable node messages and at least one elementary check node processor 1203 configured to determine an intermediate message and the intermediate binary vector associated with each component of the intermediate message by processing a variable node message and the intermediate message generated by the elementary check node processors 1201 located at a previous stage of the hybrid architecture.

Figure 13:
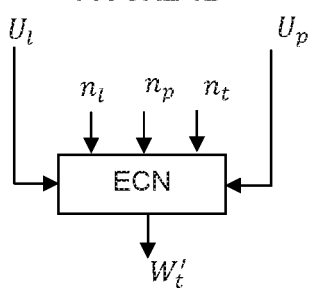
FIG. 13 is a block diagram illustrating an elementary check node processor, according to some embodiments.

In order to illustrate the computation of an intermediate message by an elementary check node processor 911-a, the following description of some embodiments will be made with reference to processing a first and a second message both equal to variable node messages. FIG. 13 shows an elementary check node processor 911-a according to such an embodiment. Accordingly, the elementary check node processor 911-a may be configured to process a first variable node message $U_l$ and a second variable node message $U_p$ for l and p≠l varying in the set of indices from $\Sigma_{a=1}^{k-1}1^{(a)}+1$ to $\Sigma_{a=1}^{k}1^{(a)}$. From these two variable node messages each comprising $n_{m,in}$ components of a symbol and its reliability metric, the elementary check node processor 911-a may be configured to determine an intermediate message denoted by $W'_t$ comprising a number $n_t$ of intermediate components $W'_t[j]=(W'_t{}^{\oplus}[j], W'_t{}^+[j])$ and to determine an intermediate binary vector denoted $W'_t{}^{DBV}[j]$ in association with each intermediate component $W'_t[j]$. The intermediate components comprised in an intermediate message may be sorted according to a given order depending on the reliability metrics of the symbols comprised therein such that $W'_t{}^+[j+1] \geq W'_t{}^+[j]$ for all j=0, . . . , $n_t-2$.

According to some embodiments, the elementary check node processor 911-a may be configured to determine the intermediate message $W'_t$, according to the three following steps.

At a first step, the elementary check node processor 911-a may be configured to determine a set of auxiliary components from the components of the first message $U_l$ and the components of the second message $U_p$. An auxiliary component is referred to as a "Bubble". A Bubble denoted by $B_t[u][v]$ refers to the Bubble obtained from the component $U_l[u]$ comprised in the first message $U_l$ and the component $U_p[v]$ comprised in the second message $U_p$. The index u varies in 0, 1, . . . , $n_l-1$ and the index v varies in 0, 1, . . . , $n_p-1$. A Bubble $B_t[u][v]=(B_t{}^{\oplus}[u][v], B_t{}^+[u][v])$ is a component which may comprise:

a symbol denoted by $B_t{}^{\oplus}[u][v]$, and its reliability metrics denoted by $B_t{}^+[u][v]$;

In addition, a binary vector denoted by $B_t{}^{DBV}[u][v]$ may be associated with the Bubble $B_t[u][v]$.

The total number of considered Bubbles varies between $n_t$ and $n_l \times n_p$, i.e. may be higher than or equal to $n_t$ and lower than or equal to $n_l \times n_p$.

According to some embodiments, the elementary check node processor 911-a may be configured to determine the symbol $B_t^\oplus[u][v]$ of an auxiliary component $B_t[u][v]$ by applying an addition operation over the algebraic structure of construction of the error correcting code. For codes constructed over Galois fields, the addition operation may be performed over the Galois Field GF(q). The addition operation is applied to the symbol $U_i^\oplus[u]$ comprised in the component $U_i[u]$ of the first message $U_i$ and to the symbol $U_p^\oplus[v]$ comprised in the component $U_p[v]$ of the second processed message $U_p$ such that:

$$B_t^\oplus[u][v] = U_i^\oplus[u] \oplus U_p^\oplus[v] \qquad (14)$$

According to some embodiments, the elementary check node processor 911-$a$ may be configured to determine the reliability metrics $B_t^+[u][v]$ of an auxiliary component $B_t[u][v]$, by applying an addition operation over a given algebraic structure, to the reliability metrics $U_i^+[u]$ comprised in the component $U_i[u]$ of the first message $U_i$ and to the reliability metrics $U_p^+[v]$ comprised in the component $U_p[v]$ of the second message $U_p$ such that:

$$B_t^+[u][v] = U_i^+[u] + U_p^+[v] \qquad (15)$$

According to some embodiments, the elementary check node processor 911-$a$ may be configured to determine the binary vector $B_t^{DBV}[u][v]$ in association with the auxiliary component $B_t[u][v]$ by applying a vector concatenation operation. The vector concatenation operation may be applied to the binary vector $U_i^{DBV}[u]$ associated with the component $U_i[u]$ of the first message $U_i$ and to the binary vector $U_p^{DBV}[v]$ associated with the component $U_p[v]$ of the second message $U_p$ such that:

$$B_t^{DBV}[u][v] = (U_i^{DBV}[u] \| U_p^{DBV}[V]) \qquad (16)$$

At a second step, the elementary check node processor 911-$a$ may be configured to sort the determined auxiliary components (Bubbles) according to a given order of the reliability metrics of the symbols comprised in these components.

At a third step, the elementary check node processor 911-$a$ may be configured to select, among the sorted auxiliary components, the $n_t$ components comprising the most reliable symbols, which provides the intermediate message $W_t'$ and the binary vector associated with each component of the $n_t$ components comprised in this intermediate message.

Further, the number $n_t$ of components comprised in an intermediate message may be lower than the number of considered Bubbles.

It should be noted that the sorting of the sub-check node syndromes generated by a calculation unit 91 in a Bubble-syndrome sub-check node architecture is performed within the elementary check node processors 911-$a$ for $a = 1, \ldots, l^{(k)}-1$ which output sorted intermediate components in the intermediate messages.

Figure 14:
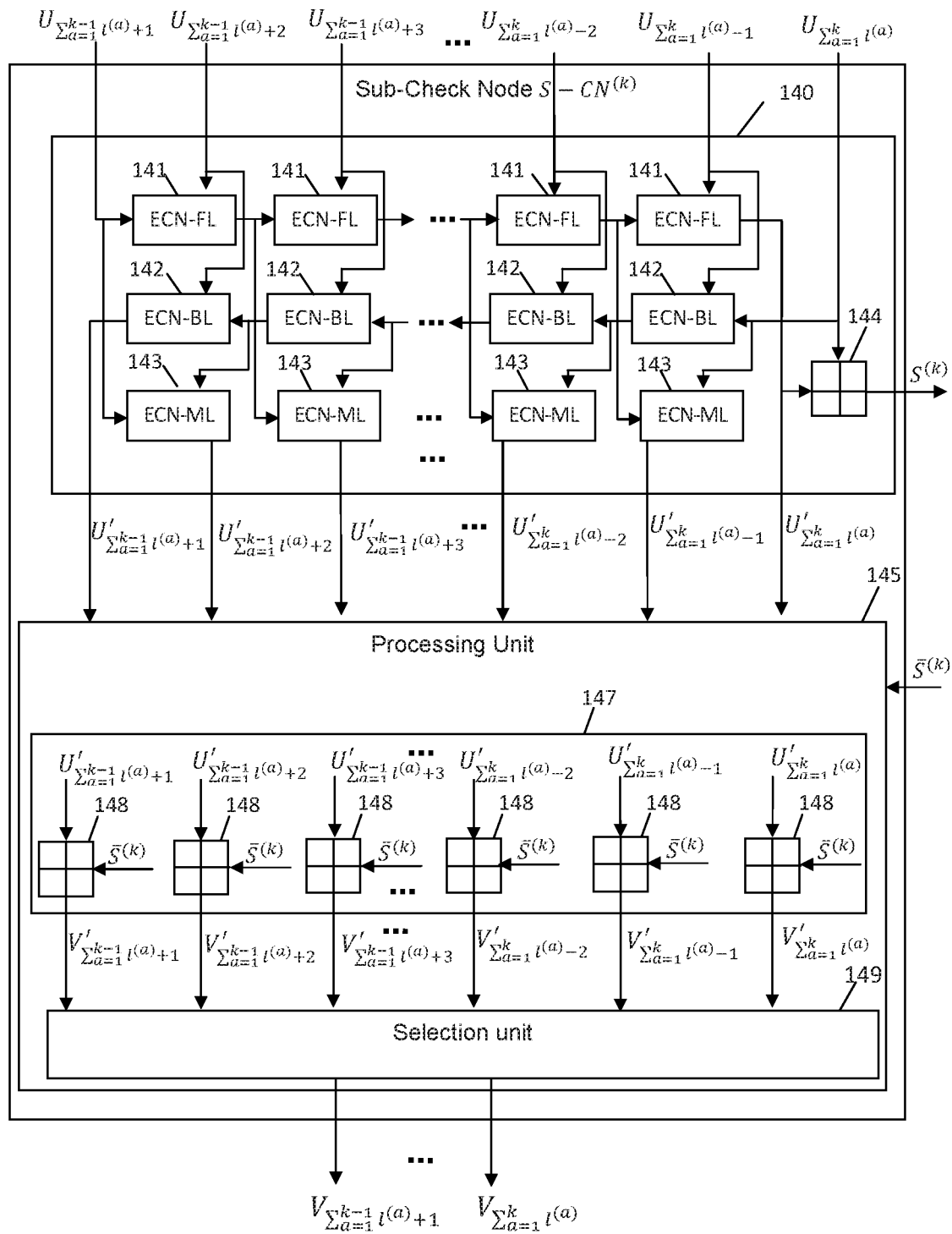
FIG. 14 is a block diagram illustrating the structure of a block of sub-check node, according to some embodiments.

FIG. 14 is a block diagram illustrating the structure of a sub-check node S–CN$^{(k)}$ 40-$k$, according to some embodiments in which the first configuration previously illustrated through FIG. 4 is used and in which the calculation unit implements a modified Forward-Backward architecture.

Similarly to the Bubble-syndrome sub-check node architecture, the calculation unit in a Forward-Backward architecture may involve a plurality of elementary check node processors in addition to an elementary calculation unit configured to determine the sub-check node of syndromes from the elementary results generated by the elementary check node processors. More specifically, and according to FIG. 14, the sub-check node S–CN$^{(k)}$ 40-$k$ may comprise a calculation unit 140 configured to comprise:

($3^{l(k)}-6$) elementary check node processors partitioned into 3 categories associated with three processing layers referred to hereinafter as a 'forward layer', a 'backward layer' and a 'merging layer', respectively. The forward layer may comprise $1^{(k)}-2$ elementary check node processors ECN-FL 141. The backward layer may comprise $1^{(k)}-2$ elementary check node processors ECN-BL 142. The merging layer may comprise $d_j-2$ elementary check node processors ECN-ML 143, and an elementary calculation unit 144 configured to generate a set of sub-check node syndromes $S^{(k)}$ from the intermediate messages generated by the various elementary check node processors comprised in the three processing layers with the variable node message $U_{\Sigma_{a=1}^k l^{(a)}}$.

The processing performed at each of the elementary check node processors ECN-FL 141, ECN-BL 142, and ECN-ML 143, is similar to the processing performed by an elementary check node processor 911-$a$ as described above, except that the elementary check node processors implemented in a Forward-Backward architecture may additionally perform a redundancy elimination for selecting, among the sorted auxiliary components, the components comprising the most reliable distinct symbols.

In such an architecture, the calculation unit 140 may be further configured, in addition to the generation of the sub-check node syndromes $S^{(k)}$, to send the elementary messages $$W'_{\sum_{a=1}^{k-1} l^{(a)}+1}, \cdots, W'_{\sum_{a=1}^{k} l^{(a)}},$$

generated by the elementary check node processors ECN-ML 143 located at the merging layer, to the processing unit 145. The intermediate check node messages $$U'_{\sum_{a=1}^{k-1} l^{(a)}+1}, \cdots, U'_{\sum_{a=1}^{k} l^{(a)}}$$

delivered by the calculation unit 140 in this case coincide with the elementary messages $$W'_{\sum_{a=1}^{k-1} l^{(a)}+1}, \cdots, W'_{\sum_{a=1}^{k} l^{(a)}}$$

generated by the elementary check node processors ECN-ML 143.

Further, the processing unit 145 may be configured to:

receive the set $\overline{S}^{(k)}$ comprising syndromes calculated from the sub-check node syndromes previously determined by one or more of the remaining blocks of sub-check nodes;

comprise $1^{(k)}$ elementary computation units 148 configured each to determine a candidate check node message $V_{i(k)}'$ for $i(k) = \sum_{a=1}^{k-1} l^{(a)}+1, \ldots, \sum_{a=1}^{k} l^{(a)}$ from the received set $\overline{S}^{(k)}$ of syndromes and the intermediate messages $U_{i(k)}'$.

Given that redundancy elimination of duplicates of intermediate components comprising a same symbol may have been performed at the level of the elementary check node processors ECN-FL 141, ECN-BL 142, and ECN-ML 143, the candidate check node messages $V_{i(k)}'$ may comprise each, candidate check node components comprising distinct symbols.

The processing unit 145 may further comprise a selection unit 149 configured to determine the check node messages $V_{i(k)}$ for $i(k)=\Sigma_{a=1}^{k-1}l^{(a)}+1,\ldots,\Sigma_{a=1}^{k}l^{(a)}$, a check node message $V_{i(k)}$ being determined by selecting, among the components comprised in the candidate check node message $V_{i(k)}'$, the $n_{m,out}$ most reliable candidate check node components.

Figure 15:
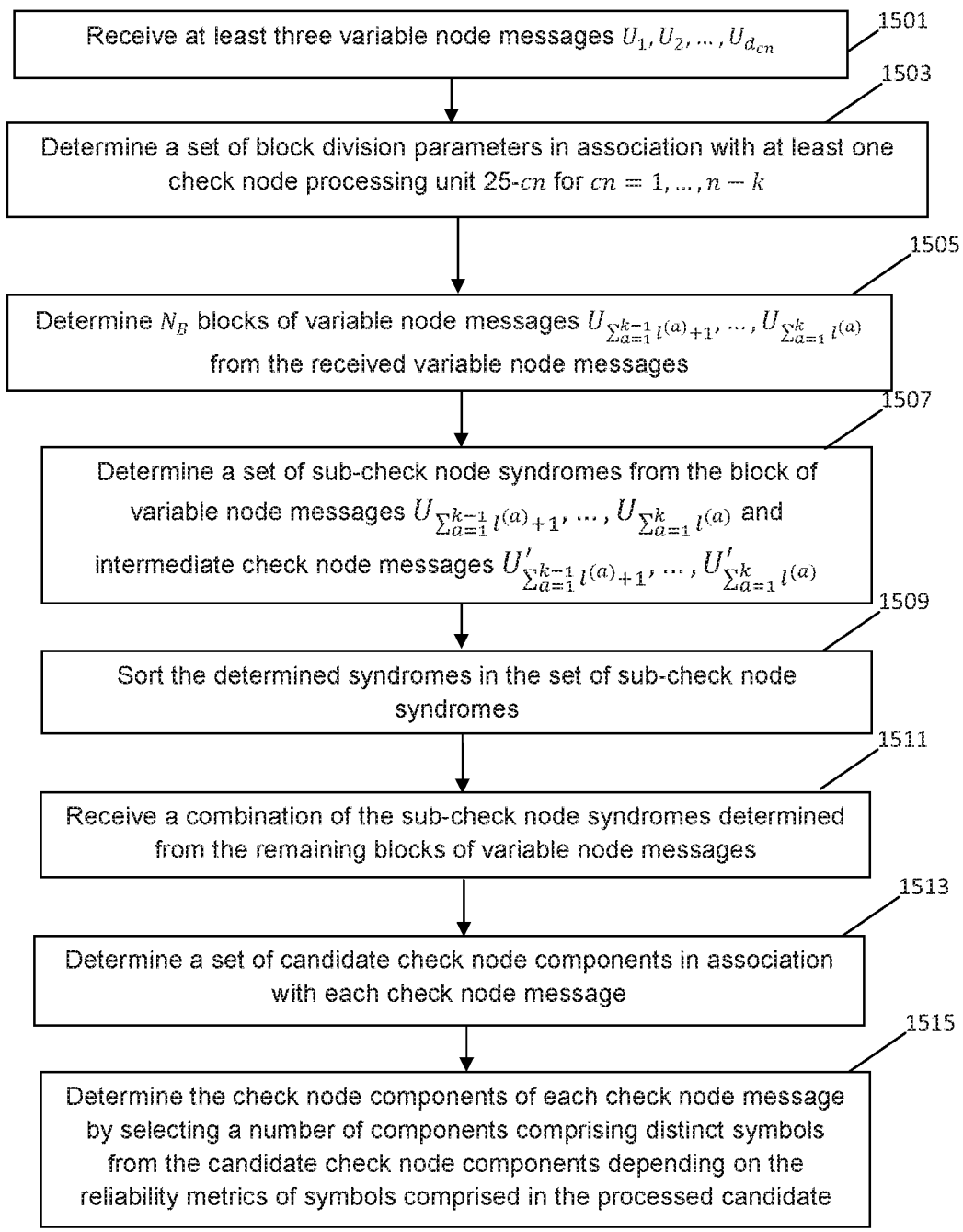
FIG. 15 is a flowchart illustrating a method of determining at least one check node message, according to some embodiments using the EMS algorithm, a block division and computation of check node messages.
Figure 16:
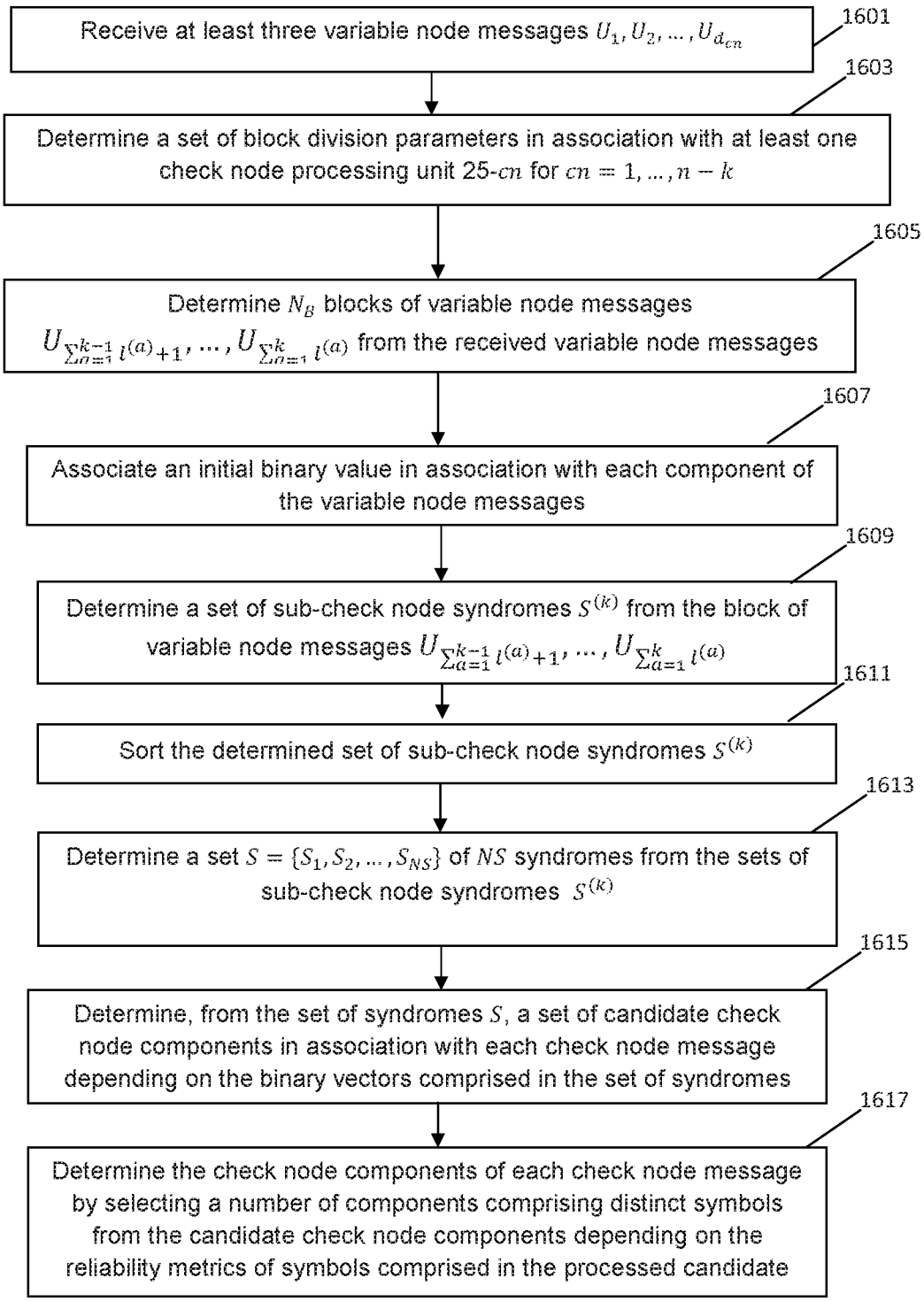
FIG. 16 is a flowchart illustrating a method of determining at least one check node message, according to some embodiments using the EMS algorithm, a block division and computation of check node messages.

FIGS. 15 and 16 are flowcharts illustrating each a method of determining check node messages of at least one check node processing unit 25-cn implemented in application to the EMS algorithm for decoding non-binary LDPC codes according to various embodiments in which block division and computation of check node messages are performed using the first configuration previously illustrated through FIG. 4 and the second configuration illustrated through FIG. 5, respectively.

The following description of some embodiments will be made with reference to soft-output decoding and reliability metrics represented in the logarithm domain by log-likelihood ratio (LLR) values, for illustration purposes only. However, the skilled person will readily understand that other types of decoding and reliability metrics may be used to measure the reliability of symbols. For instance, the reliability metrics may be a quadratic distance or any monotonic function of the probability density function of symbols.

The computed check node messages by at least one check node processing unit are exchanged with the variable node processing units during the iterative decoding process of the EMS algorithm. The decoding process may be performed to determine an estimate ĉ of an original codeword c from a received noisy sequence represented by a vector $y=(y_1,\ldots,y_n)$ by applying the Belief Propagation decoding rule. The codeword $c=(c_1,\ldots,c_n)$ may has been encoded at the transmitter using a non-binary LDPC code designated by $\mathcal{C}$ (n, K) constructed over the Galois Field GF(q) with q>2.

The LLR is a metric measuring the reliability of a symbol. One definition of the LLR metric involves a fixed reference symbol. A reference symbol of the symbol $c_i$ noted $\beta_i$ may correspond to the most reliable symbol satisfying:

$$\beta_i = \text{argmax}_{t=0,\ldots,q-1} p(\alpha_t|y_i) \quad (17)$$

In equation (17), $\alpha_t$ designates a GF symbol.

Accordingly, for the $i^{th}$ symbol $c_i$, the LLR value for this symbol to be equal to $\alpha_t$ is noted $LLR_t(c_i)$ and may be expressed as:

$$LLR_t(c_i) = -\log\left(\frac{p(c_i = \alpha_t | y_i)}{p(c_i = \beta_i | y_i)}\right) \quad (18)$$

Using such definition of the LLR metric, the most reliable symbols are those that have smallest LLR values according to equation (18).

For the clarity of the presentation, the following description of some embodiments will be made with a focus on the processing at a check node processing unit of degree $d_{cn} \geq 3$ receiving $d_{cn}$ sorted and truncated variable node messages $U_1, U_2, \ldots, U_{d_{cn}}$ and generating $d_{cn}$ check node messages $V_1, V_2, \ldots, V_{cn}$.

FIG. 15 corresponds to a block computation of check node messages implementing the first configuration.

Step 1501 may be performed to receive at least three (3) variable node messages $U_1, U_2, U_3 \ldots, U_{d_{cn}}$.

Step 1503 may be performed to determine a set of block division parameters in association with at least one check node processing unit 25-cn for cn=1, . . . , n–K.

In some embodiments, a set of block division parameters associated with a check node processing unit 25-cn may comprise at least a first block division parameter $N_B \geq 2$ and a second block division parameter $l^{(k)} \geq 1$, k=1, . . . , $N_B$ satisfying $\Sigma_{k=1}^{N_B} l^{(k)} = d_{cn}$.

According to some embodiments involving at least two check node processing units 25-cn for cn=1, 2, . . . , n–K, a same set of block division parameters may be determined in association with each of the at least two check node processing units 25-cn. The same set of block division parameters may comprise a same first block division parameter and a same second block division parameter in association with each one of the at least two check node processing units 25-cn.

In other embodiments involving at least two check node processing units 25-cn for cn=1, . . . , n–K, different sets of block division parameters may be determined with at least two of said at least two check node processing units 25-cn.

According to some embodiments, the set of block division parameters may be determined depending on the received variable node messages that will be processed by the check node processing unit 25-cn.

For example, in some embodiments in which a truncation of the variable node messages is applied, a set of block division parameters may be determined depending on the number $n_{m,in}$ of components comprised in the received variable node messages.

In another example, a set of block division parameters may be determined in association with at least one check node processing unit 25-cn for cn=1, . . . , n–K depending on the degree $d_{cn}$ of the check node processing unit 25-cn.

Further, according to some embodiments, a set of block division parameters may be determined in association with at least one check node processing unit 25-cn depending on at least one parameter chosen in a group comprising one of a signal-to-noise ratio, the algebraic structure of construction of the used error correcting code $\mathcal{C}$ (n, K), and the number of iterations of the exchange of messages between the variable node processing units 27-vn and the check node processing units 25-cn.

Given the determined sets of block division parameters in association with at least one check node processing unit 25-cn, step 1505 may be performed to determine blocks of variable node messages from the received variable node messages.

The following description will be made with reference to a block division and computation of check node messages from the set of $d_{cn}$ variable node messages $U_1, U_2, \ldots, U_{d_{cn}}$ divided into $N_B$ blocks of variable node messages, a block of index k for k=1, . . . , $N_B$ comprising $l^{(k)} \geq 1$ variable node messages $$U_{\Sigma_{a=1}^{k-1} l^{(a)}+1}, \ldots, U_{\Sigma_{a=1}^{k} l^{(a)}},$$

for illustration purpose only. The decoding method enables the determination of check node messages $V_1, V_2, \ldots, V_{d_{cn}}$ by $N_B$ blocks of check node messages, each block of $l^{(k)}$ check node messages $$V_{\Sigma_{a=1}^{k-1} l^{(a)}+1}, \ldots, V_{\Sigma_{a=1}^{k} l^{(a)}}$$

being determined from the variable node messages $$U_{\sum_{a=1}^{k-1} l^{(a)}+1}, \ldots, U_{\sum_{a=1}^{k} l^{(a)}}$$

and the results derived from the remaining blocks of indices b=1, ..., $N_B$ with b≠k. More specifically, the block of check node messages $$V_{\sum_{a=1}^{k-1} l^{(a)}+1}, \ldots, V_{\sum_{a=1}^{k} l^{(a)}}$$

may be determined from the variable node messages $$U_{\sum_{a=1}^{k-1} l^{(a)}+1}, \ldots, U_{\sum_{a=1}^{k} l^{(a)}}$$

and from the set of syndromes $\overline{S}^{(k)}$ comprising syndromes calculated from the sets $S^{(b)}$ of sub-check node syndromes determined by the block of index b=1, ..., $N_B$/b≠k from the variable node messages $$U_{\sum_{a=1}^{b-1} l^{(a)}+1}, \ldots, U_{\sum_{a=1}^{b} l^{(a)}}.$$

Step 1507 may be performed to determine a set $S^{(k)}= \{S_1^{(k)}, S_2^{(k)}, \ldots, S_{NS^{(k)}}^{(k)}\}$ of $NS^{(k)}$ sub-check node syndromes $S_r^{(k)}$, r=1, ..., $NS^{(k)}$ and intermediate check node messages $$U'_{\sum_{a=1}^{k-1} l^{(a)}+1}, \ldots, U'_{\sum_{a=1}^{k} l^{(a)}}$$

from the one or more variable node components $U_{i(k)}[j]$ ($U_{i(k)}^{\oplus}[j]$, $U_{i(k)}^{+}[j]$) for j=0, ..., $n_{m,in}-1$ comprised in the variable node messages $U_{i(k)}$ with $i(k)=\sum_{a=1}^{k-1} l^{(a)}+1, \ldots, \sum_{a=1}^{k} l^{(a)}$. More specifically, a syndrome $S_r^{(k)}$ may comprise:
a symbol $S_r^{(k),\oplus}$ which may be determined from the symbols $U_{i(k)}^{\oplus}[j]$, for j=0, ..., $n_{m,in}-1$, comprised in the one or more variable node components $U_{i(k)}[j]$, j=0, ..., $n_{m,in}-1$ comprised in the at least one variable node message $U_{i(k)}$ with $i(k)=\sum_{a=1}^{k-1} l^{(a)}+1, \ldots, \sum_{a=1}^{k} l^{(a)}$ according to equation (4);
the reliability metrics $S_r^{(k),+}$ associated with a symbol $S_r^{(k),\oplus}$ may be determined from the reliability metrics $U_{i(k)}^{+}[j]$, for j=0, ..., $n_{m,in}-1$ comprised in the one or more variable node components $U_{i(k)}[j]$, j=0, ..., $n_{m,in}-1$ comprised in the at least one variable node message $U_{i(k)}$ with $i(k)=\sum_{a=1}^{k-1} l^{(a)}+1, \ldots, \sum_{a=1}^{k} l^{(a)}$ according to equation (5).

Step 1509 may be performed to sort the determined syndromes $S_r^{(k)}$ for r=1, ..., $NS^{(k)}$ in the sets $S^{(k)}$ of sub-check node syndromes into a given order of the reliability metrics $S_r^{(k),+}$.

Step 1511 may be performed to receive the set $\overline{S}^{(k)}$ comprising syndromes calculated from the sets $S^{(b)}$ of sub-check node syndromes determined from the remaining blocks with b≠k and b=1, ..., $N_B$.

Step 1513 may be performed to determine, from the set $\overline{S}^{(k)}$ of syndromes and the intermediate sub-check node messages, a set of candidate check node components, the candidate check node components comprising one or more components comprising a symbol and a reliability metric. In some embodiments, the candidate check node components may comprise two or more components comprising a same symbol.

Step 1515 may be further performed to determine the check node messages $$V_{\sum_{a=1}^{k-1} l^{(a)}+1}, \ldots, V_{\sum_{a=1}^{k} l^{(a)}},$$

the check node messages comprising distinct symbols and being determined by selecting a number of check node components $n_{m,out}$ from the determined set of candidate check node components depending on the reliability metrics associated with the symbols, the check node components comprising distinct symbols.

According to some embodiments, the number $n_{m,out}$ of check node components may be different from the number $n_{m,in}$ of components in the variable node messages. In particular, the number of check node components may satisfy $n_{m,out} \geq n_{m,in}$.

In some embodiments, the number $n_{m,out}$ of check node components may depend on the number of components $n_{m,in}$ comprised in the variable node messages.

The number $n_{m,out}$ of check node components may further depend on the error correcting code (e.g. the algebraic structure over which the code is constructed) and/or on the order of the decoding iteration of the iterative decoding process and/or on the signal-to-noise ratio and/or on the computational and storage capabilities of the check node processing units 25-cn implementing the block computation method of check node messages.

In some other embodiments, the number $n_{m,out}$ of check node components may depend on a combination of the factors previously cited.

FIG. 16 illustrates a method of computing check node messages according to the second configuration.

Step 1601 may be performed to receive at least three variable node messages.

Steps 1603 and 1605 may be performed similarly to the steps 1503 and 1505, respectively.

Step 1607 may be performed to determine initial binary values in association with each component comprised in the variable node messages $$U_{\sum_{a=1}^{k-1} l^{(a)}+1}, \ldots, U_{\sum_{a=1}^{k-1} l^{(a)}}$$

depending on the reliability metrics $U_{i(k)}^{+}[j]$ associated with the symbols $U_{i(k)}^{\oplus}[j]$. In particular:
an initial binary value equal to a predefined first value may be determined in association with the component $U_{i(k)}[0]$ comprising the most reliable symbol, and
an initial binary value equal to a predefined second value may be determined in association with the remaining components $U_{i(k)}[j]$ for j=1, ..., $n_{m,in}-1$.

According to some embodiments, the predefined first value may be equal to zero ('0') and the predefined second value may be equal to one ('1'). In such embodiments, the binary value associated with a component $U_{i(k)}[j]$ may be given by equation (6).

According to other embodiments, the predefined first value may be equal to one ('1') and the predefined second value may be equal to zero ('0'). Accordingly, the initial binary value associated with a component comprised in a variable node message maybe equal to bit '1' if the symbol comprised in this component is the most reliable symbol, according to equation (7).

Step 1609 may be performed to determine a set $S^{(k)}=\{S_1^{(k)}, S_2^{(k)}, \ldots, S_{NS^{(k)}}^{(k)}\}$ of $NS^{(k)}$ sub-check node syndromes $S_r^{(k)}$, r=1, ..., $NS^{(k)}$ from the one or more variable node components $U_{i(k)}[j]=(U_{i(k)}^\oplus[j], U_{i(k)}^+[j])$ for j=0, ..., $n_{m,in}-1$. More specifically, a syndrome S(k) may comprise:

a symbol $S_r^{(k),\oplus}$ which may be determined from the symbols $U_{i(k)}^\oplus[j]$, for j=0, ..., $n_{m,in}-1$, comprised in the one or more variable node components $U_{i(k)}[j]$, j=0, ..., $n_{m,in}-1$ comprised in the at least one variable node message $U_{i(k)}$ with $i(k)=\Sigma_{a=1}^{k-1} l^{(a)}+1, \ldots, \Sigma_{a=1}^{k} l^{(a)}$ according to equation (4);

the reliability metrics $S_r^{(k),+}$ associated with a symbol $S_r^{(k),\oplus}$ may be determined from the reliability metrics $U_{i(k)}^+[j]$, for j=0, ..., $n_{m,in}-1$ comprised in the one or more variable node components $U_{i(k)}[j]$, j=0, ..., $n_{m,in}-1$ comprised in the at least one variable node message $U_{i(k)}$ with $i(k)=\Sigma_{a=1}^{k-1} l^{(a)}+1, \ldots, \Sigma_{a=1}^{k} l^{(a)}$ according to equation (5);

a binary vector $S_r^{(k),DBV}$ which may be determined from the initial binary values $U_{i(k)}^{DBV}[j]$ associated with each component $U_{i(k)}[j]=(U_{i(k)}^\oplus[j], U_{i(k)}^+[j])$ for j=0, ..., $n_{m,in}-1$, of the variable node messages $U_{i(k)}$ for $i(k)=\Sigma_{a=1}^{k-1} l^{(a)}+1, \ldots, \Sigma_{a=1}^{k} l^{(a)}$ according to equation (8). A binary vector $S_r^{(k),DBV}$ comprised in a syndrome $S_r^{(k)}$ comprises $l^{(k)}$ bits.

Step 1611 may be performed to sort the determined set of sub-check node syndromes $S^{(k)}$ into a given order of the reliability metrics $S_r^{(k),+}$.

Step 1613 may be performed to determine a set $S=\{S_1, S_2, \ldots, S_{NS}\}$ of NS syndromes from the sets of sub-check node syndromes $S^{(k)}$, k=1, ..., $N_B$. A syndrome $S_r=(S_r^\oplus, S_r^+, S_r^{DBV})$ for r=1, ..., NS may comprise a GF(q) symbol $S_r^\oplus$, the reliability metrics associated with this symbol $S_r^+$, and a binary vector $S_r^{DBV}$ According to the calculation performed on the sets of sub-check node syndromes a syndrome $S_r$ may be expressed as a function of the components of the variable node messages $U_1, U_2, \ldots, U_{d_{cn}}$ such that:

a symbol $S_r^\oplus$ comprised in the syndrome $S_r$ for r=1, ..., NS may be expressed as a function of the symbols comprised in the variable node messages $U_1, U_2, \ldots, U_{d_{cn}}$ according to equation (9);

the reliability metrics $S_r^+$ associated with the symbol $S_r^\oplus$ may be expressed as a function of the reliability metrics comprised in the different components of the variable node messages $U_1, U_2, \ldots, U_{d_{cn}}$ according to equation (10); and the binary vector $S_r^{DBV}$ comprised in the syndrome $S_r$ may be written as a function of the initial binary values associated with each component of the variable node messages according to equation (11).

Step 1615 may be performed to determine, from the set S of syndromes a set of candidate check node components in association with each check node message depending on the binary vectors comprised in the set of syndromes, the candidate check node components comprising one or more components comprising a symbol and a reliability metric.

Step 1617 may be performed to determine the check node components of each check node message by selecting a number of check node components $n_{m,out}$ from the determined set of candidate check node components depending on the reliability metrics associated with the symbols, the check node components comprising distinct symbols.

It should be noted that flowcharts 15 and 16 illustrate the processing at the level of a check node processing unit 25-*cn* receiving a set of variable node messages delivered by the variable node processing units associated with the variable nodes in the set $\mathcal{H}_c(cn)$. As the processing at the check node processing units is a part of the iterative decoding process, the delivered check node messages may be further processed (for example by the signal estimation unit 29) in order to check if the parity-check equation is satisfied and decide whether to continue the iterative decoding process or to stop. More specifically:

if a maximum number of iterations is not yet reached and the parity-check equation is not satisfied, the check node messages delivered by the check node processing units 25-*cn* for cn=1, ..., n−K may be sent to the corresponding variable node processing units 27-*vn*;

if the processed signal satisfies the parity-check equation, the decoding process may terminate and the processed signal may be delivered as an estimate of the original codeword;

if a maximum number of iterations is reached without meeting all parity-check constraints, a decoding failure may be declared and the codeword estimated at the last iteration may be output as an estimate of the original codeword.

The architectures according to the embodiments of the invention advantageously provide optimal decoding performance with a significant reduction of the decoding computational complexity and implementation hardware cost, in addition to a significant improvement in terms of latency.

The methods and devices described herein may be implemented by various means. For example, these techniques may be implemented in hardware, software, or a combination thereof. For a hardware implementation, the processing elements of an iterative decoder 123 can be implemented for instance according to a hardware-only configuration (as example, in one or more FPGA, ASIC or VLSI integrated circuits with the corresponding memory) or according to a configuration using both VLSI and DSP.

While embodiments of the invention have been illustrated by a description of various examples, and while these embodiments have been described in considerable detail, it is not the intent of the applicant to restrict or in any way limit the scope of the appended claims to such details. Additional advantages and modifications will readily appear to those skilled in the art. The invention in its broader aspects is therefore not limited to the specific details, representative methods, and illustrative examples shown and described.

In particular, while the description of some embodiments has been performed with reference to a block division of a check node processing unit into $N_B$ blocks of sub-check nodes implementing a sub-check node architecture of a single type, it should be noted that the invention may also be applied to a mixed architecture in which two or more sub-check nodes implement two architectures of different types.

Furthermore, the invention may be combined with variable node messages presorting techniques disclosed in European patent application No 16305510.6. In such embodiments, the decoder 123 may further comprise at least one message permutation unit configured to apply a transformation operation (e.g. permutation) to at least some of the variable node messages prior to their processing at the level of check node processing units. The decoder 123 may also comprise a switching unit configured to apply the inverse of the transformation operation to the check node messages after their computation in order to route each check node message to the corresponding variable node processing unit configured to receive it.

Figure 17:
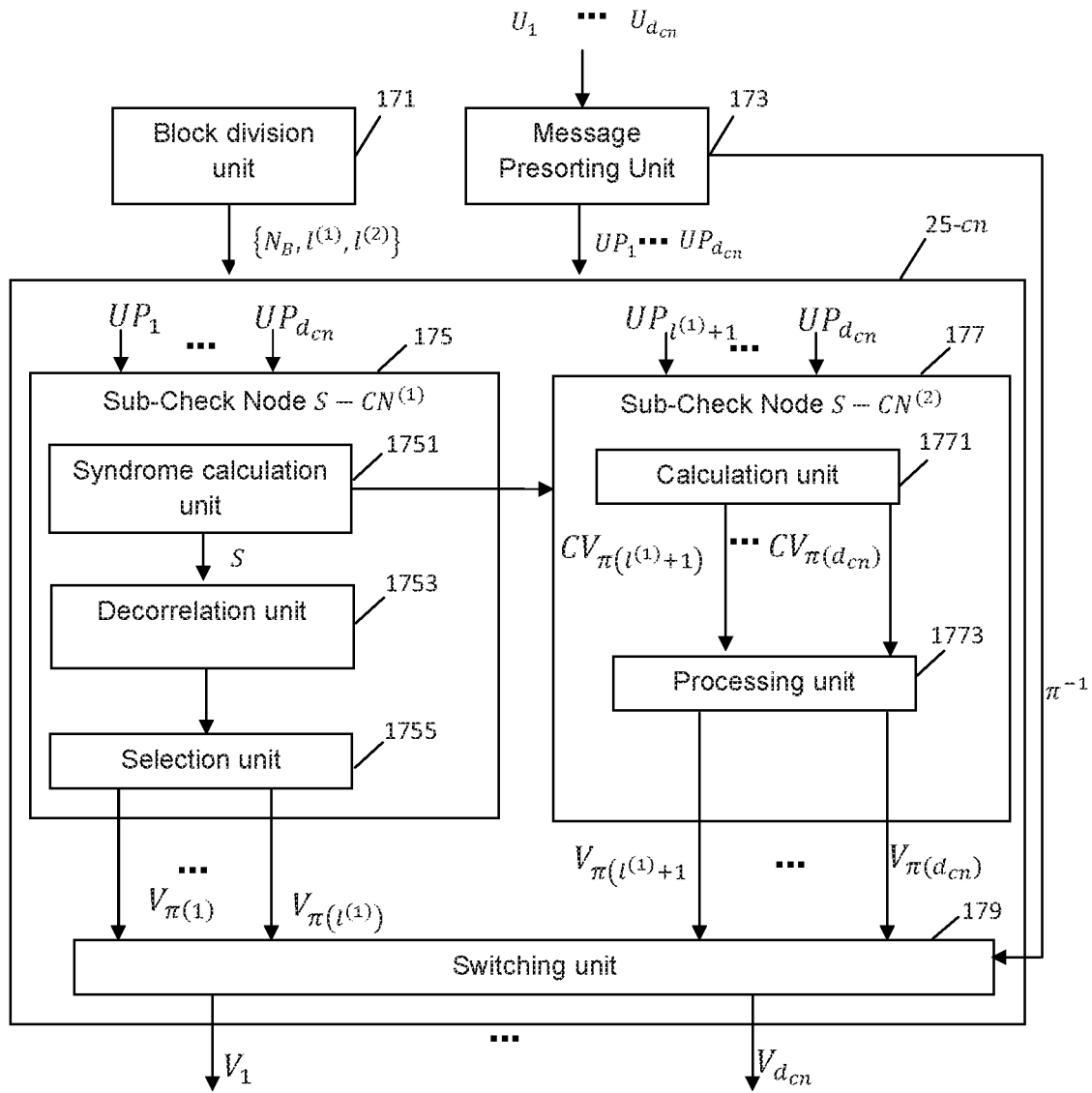
FIG. 17 is a block diagram illustrating a check node processing unit, according to some embodiments in which are performed a presorting of variable node messages and a block division of the check node processing unit into two sub-check node blocks implementing different architectures.

FIG. 17 is a block diagram illustrating the structure of a check node processing unit 25-*cn* in embodiments in which a presorting of the variable node messages is performed at a message presorting unit 173 using one or more permutations w and according to a division into two sub-check nodes of different types such that:

the sub-check node S–CN$^{(1)}$ 175 implements a syndrome sub-check node architecture, and the sub-check node S–CN$^{(2)}$ 177 implements a forward-backward sub-check node architecture.

In such embodiments, the check node messages computed by the sub-check nodes are denoted by $V_{\pi(i)}$ for i=1, . . . , $d_{cn}$, the check node message $V_{\pi(i)}$ corresponding to the permutation of the check node message $V_i$ using the one or more permutations π.

In such embodiments using the presorting of variable node messages, the check node processing unit 25-cn may further comprise a switching unit 179 configured to switch back the permuted check node messages $V_{\pi(i)}$ in order to generate the check node messages $V_i$ in a such a way that each variable node processing unit in the set $\mathcal{H}_c$(cn) receives its designated check node message. The switching unit 179 may apply the inverse permutation $\pi^{-1}$ corresponding to the inverse of the one or more permutations w which may be received from the message permutation unit 173.

Further, in embodiments using the variable node messages presorting in combination with blocks of sub-check nodes of similar or different types involving at least one syndrome-based block of sub-check node, the switching back operation (performed to route the computed check node messages to their corresponding variable node processing units) may be combined with the decorrelation process performed by said at least one syndrome-based block of sub-check node. More details on the simplification of the switching operation as a part of the decorrelation process can be found in European patent application No EP17305747.2 or No EP17305748.0 assigned to the same entity as the instant application and filed the same day.

Moreover, while the description of some embodiments of the invention has been performed with reference to a particular implementation to the EMS algorithm, it should be noted that the invention may also apply to other iterative decoding algorithms such as the min-max algorithm.

Furthermore, while some embodiments of the invention have been described with reference to error correcting codes constructed over Galois Fields, the skilled person will readily understand that the proposed embodiments based on elementary check node processing for syndrome computation may be also applied to any LDPC codes and any graph error correcting code constructed over non-commutative groups such as polynomial codes (e.g. cyclic codes).

Further, the invention has obviously some advantages in an application to communication systems, but it should be noted that the invention is not limited to such communication devices and may be integrated advantageously in numerous devices such as data storage devices.

The methods described herein can be implemented by computer program instructions supplied to the processor of any type of computer to produce a machine with a processor that executes the instructions to implement the functions/acts specified herein. These computer program instructions may also be stored in a computer-readable medium that can direct a computer to function in a particular manner. To that end, the computer program instructions may be loaded onto a computer to cause the performance of a series of operational steps and thereby produce a computer implemented process such that the executed instructions provide processes for implementing the functions specified herein.

The invention claimed is:

1. A decoder comprising at least one check node processing unit configured to receive at least three variable node messages from one or more variable node processing units and to determine one or more check node messages, each variable node message and each check node message comprising components, a component comprising a symbol and a reliability metrics associated with said symbol, wherein the decoder is configured to perform a division of at least one check node processing unit into at least two blocks of sub-check nodes using a set of block division parameters, each of said blocks of sub-check nodes being configured to:

determine a set of sub-check node syndromes from at least one variable node message among said at least three variable node messages, each of said sub-check node syndromes comprising a symbol and a reliability metrics associated with said symbol; and determine at least one check node message from at least one syndrome among said set of sub-check node syndromes.

2. The decoder of claim 1, wherein the decoder further comprises at least one message presorting unit configured to determine permuted variable node messages by applying one or more permutations to the at least three variable node messages, each of said blocks of sub-check nodes being configured to determine said set of sub-check node syndromes from at least one permuted variable node message of said permuted variable node messages.

3. The decoder of claim 1, wherein at least one of said blocks of sub-check nodes implement a syndrome sub-check node architecture and at least one of said blocks of sub-check nodes implementing a forward-backward architecture.

4. The decoder of claim 1, wherein the set of block division parameters is determined in association with each check node processing unit and comprises at least:

a first block division parameter representing a number of said blocks of sub-check nodes comprised in a check node processing unit, the first block division parameter being at least equal to two, and a second block division parameter representing a number of variable node messages processed by each of said blocks of sub-check nodes comprised in said check node processing unit.

5. The decoder of claim 1, wherein the decoder is configured to determine a same set of block division parameters in association with each of said check node processing units.

6. The decoder of claim 1, comprising at least two check node processing units, the decoder being configured to determine a set of block division parameters in association with each of said at least two check node processing units, said set of block division parameters comprising at least a block division parameter for one of said at least two check node processing units that is different from a block division parameter determined for another check node processing unit among said at least two check node processing units.

7. The decoder of claim 1, configured to determine, from at least one of said check node messages, an estimate of a signal encoded using at least one error correcting code, each of said check node processing unit being configured to send at least one check node message to said one or more variable node processing units during a number of iterations, the decoder being configured to determine a set of block division parameters in association with at least one check node processing unit depending on at least one parameter chosen in a group comprising one of a signal-to-noise ratio, an algebraic structure of construction of said at least one error correcting code, the at least three variable node messages, and said number of iterations.

8. The decoder of claim 1, wherein each of said blocks of sub-check nodes is configured to determine a set of sub-check node syndromes comprising syndromes at least partially sorted into a given order of the reliability metrics associated with the symbols.

9. The decoder of claim 8, wherein each variable node message comprises one or more variable node components, each variable node component comprising a symbol and a reliability metrics associated with the symbol, each variable node message being sorted into a given order of the reliability metrics comprised in the one or more variable node components, the at least one check node processing unit further comprising a syndrome calculation unit configured to determine a set of syndromes from one or more of the sub-check node syndromes, a sub-check node comprising:
  a calculation unit configured to determine a set of sub-check node syndromes from said variable node components, a symbol of a syndrome being determined from the symbols comprised in the variable node components, and the reliability metrics associated with said determined symbol being determined from the reliability metrics comprised in said variable node components;
  a processing unit configured to receive the set of syndromes determined by the syndrome calculation unit and to determine the at least one check node message from said set of syndromes, a check node message comprising one or more check node components, a check node component comprising a symbol and a reliability metrics associated with the symbol, said one or more check node components comprising distinct symbols.

10. The decoder of claim 9, wherein the calculation unit is configured to determine said set of sub-check node syndromes using at least one elementary check node processor, an elementary check node processor being configured to determine an intermediate message from a first message and a second message, said first message and second message being derived from said at least two variable node messages, said intermediate message comprising one or more intermediate components and an intermediate binary vector in association with each intermediate component, each intermediate component comprising a symbol and a reliability metrics associated with said symbol, said one or more intermediate components being sorted according to an order of the reliability metrics associated with the symbols and comprising one or more intermediate components comprising a same symbol, the at least one elementary check node processors being configured to determine said set of sub-check node syndromes from the intermediate message determined from all variable node messages.

11. The decoder of claim 10, wherein the calculation unit of at least one block of sub-check node comprises at least two elementary check node processors implemented in a serial architecture.

12. The decoder of claim 10, wherein the calculation unit of at least one block of sub-check node comprises at least two elementary check node processors implemented in a tree architecture.

13. The decoder of claim 10, wherein the calculation unit of at least one block of sub-check node comprises at least two elementary check node processors implemented in a hybrid architecture, said hybrid architecture comprising at least one elementary check node processor implemented in a serial architecture and at least one elementary check node processors implemented in a tree architecture.

14. The decoder of claim 9, wherein the calculation unit comprises at least one elementary check node configured to determine an intermediate message from a first message and a second message, said first message and second message being derived from said at least two variable node messages, said intermediate message comprising one or more intermediate components and an intermediate binary vector in association with each intermediate component, said one or more intermediate components being sorted according to an order of the reliability metrics associated with the symbols and comprising distinct symbols, the calculation unit being configured to determine said set of sub-check node syndromes from the intermediate message determined from all of said at least two variable node messages.

15. The decoder of claim 1, wherein the decoder is configured to determine, from at least one of said check node messages, an estimate of a signal encoded using at least one error correcting code, said at least one error correcting code is a non-binary error correcting code.

16. A decoding method using a decoder comprising at least one check node processing unit, the method comprising:
  receiving at least three variable node messages from one or more variable node processing units and determining one or more cheek node messages, each variable node message and each check node message comprising components, each of said components comprising a symbol and a reliability metrics associated with said symbol;
  determining at least two sets of sub-check node syndromes, each set of sub-check node syndromes being determined from at least one variable node message among the received at least three variable node messages, each of said sub-check node syndromes comprising a symbol and a reliability metrics associated with said symbol; and
  determining at least one check node message from at least one syndrome, among said set of sub-check node syndromes.

* * * * *